(12) United States Patent
Cheng et al.

(10) Patent No.: US 12,107,145 B2
(45) Date of Patent: Oct. 1, 2024

(54) DENSIFIED GATE SPACERS AND FORMATION THEREOF

(71) Applicant: TAIWAN SEMICONDUCTOR MANUFACTURING COMPANY, LTD., Hsinchu (TW)

(72) Inventors: Te-En Cheng, Taoyuan (TW); Yung-Cheng Lu, Hsinchu (TW); Chi On Chui, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 473 days.

(21) Appl. No.: 17/369,693

(22) Filed: Jul. 7, 2021

(65) Prior Publication Data

US 2022/0336626 A1 Oct. 20, 2022

Related U.S. Application Data

(60) Provisional application No. 63/175,441, filed on Apr. 15, 2021.

(51) Int. Cl.
| | | |
|---|---|---|
| H01L 21/8234 | (2006.01) | |
| H01L 29/49 | (2006.01) | |
| H01L 29/66 | (2006.01) | |
| H01L 29/78 | (2006.01) | |

(52) U.S. Cl.
CPC ...... *H01L 29/6653* (2013.01); *H01L 29/4983* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 2019/0393325 A1* | 12/2019 | Chang | ............... | H01L 29/66545 |
| 2020/0303261 A1* | 9/2020 | Shen | ................... | H01L 29/6656 |
| 2020/0335392 A1* | 10/2020 | Carr | ..................... | H01L 21/7682 |

* cited by examiner

*Primary Examiner* — Joseph C. Nicely
*Assistant Examiner* — Lamont B Koo
(74) *Attorney, Agent, or Firm* — Maschoff Brennan

(57) ABSTRACT

A method includes following steps. Fins are formed over a substrate. A dummy gate structure is across the fins. A spacer layer is deposited over the dummy gate structure. The spacer layer has a first portion in a void of the dummy gate structure and a second portion outside the void of the dummy gate structure. The second portion of the spacer layer is treated to have a different material composition than the first portion of the spacer layer, and is then etched to form gate spacers on sidewalls of the dummy gate structure. An etching process is performed on the dummy gate structure to form a gate trench between the gate spacers. The etching process etches the first portion of the spacer layer at a faster etch rate than etching the gate spacers. A gate structure is formed in the gate trench.

20 Claims, 35 Drawing Sheets

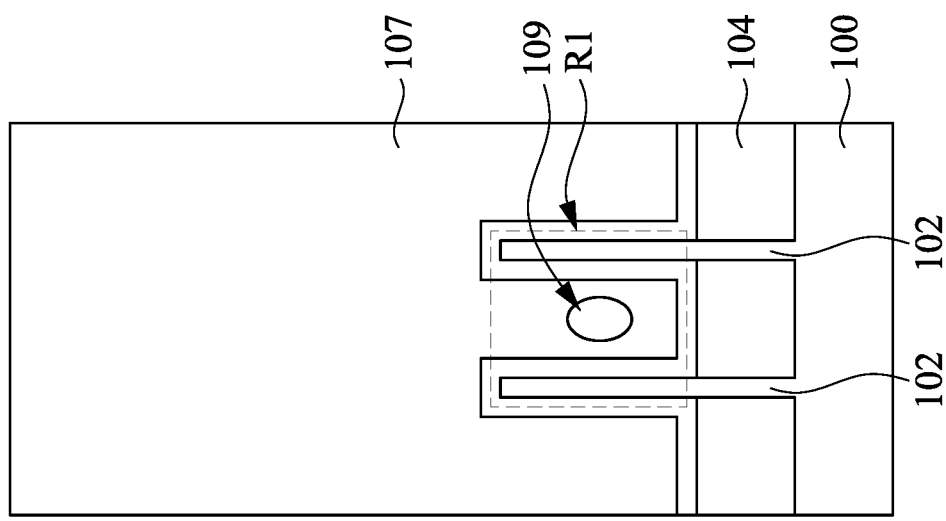

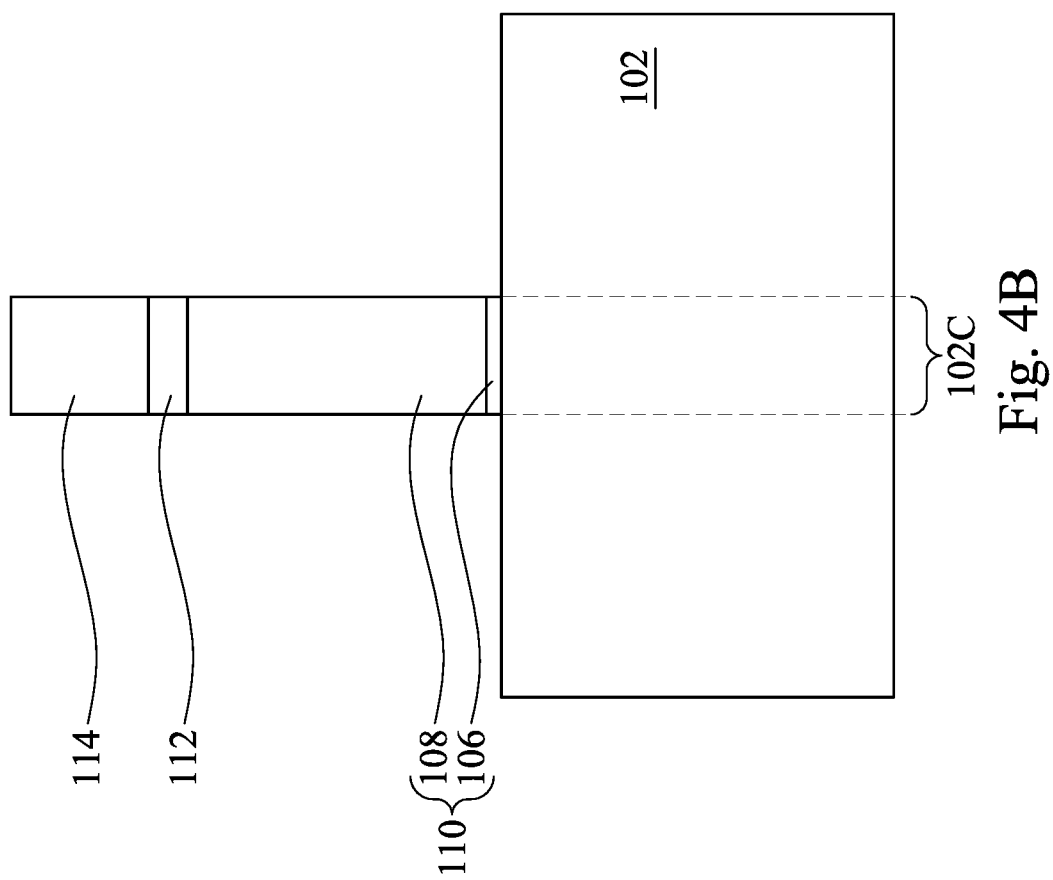

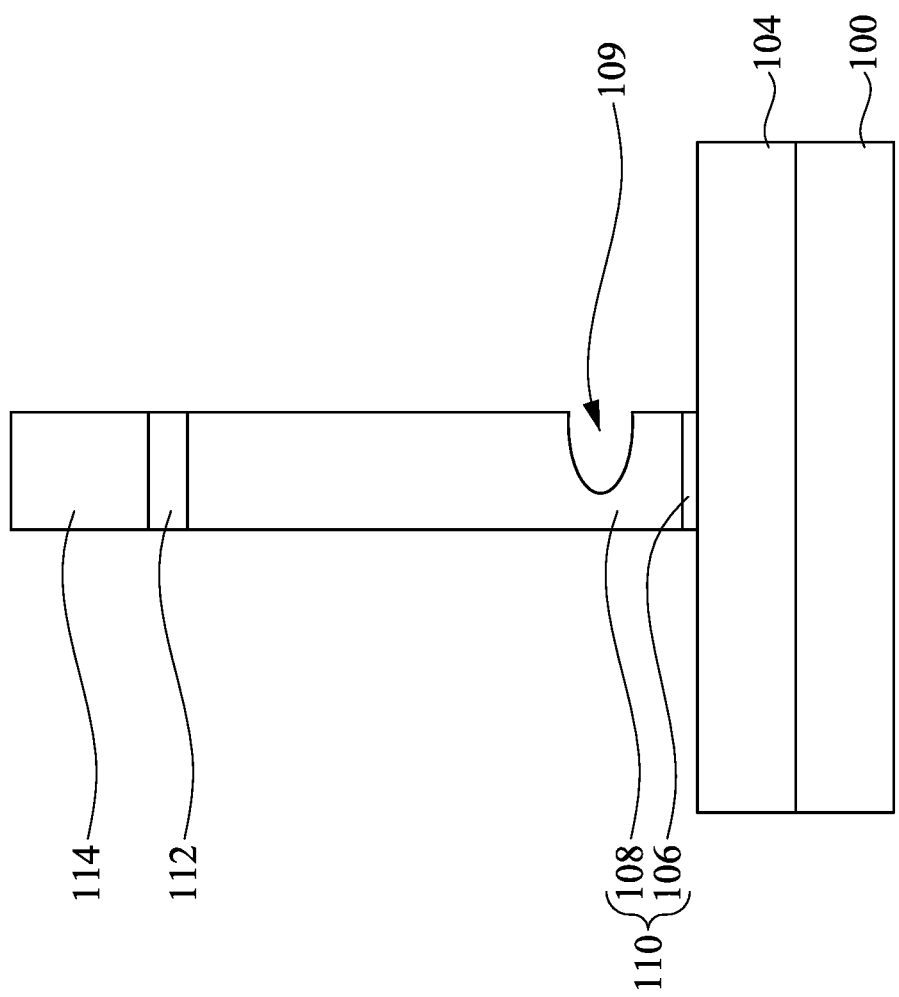

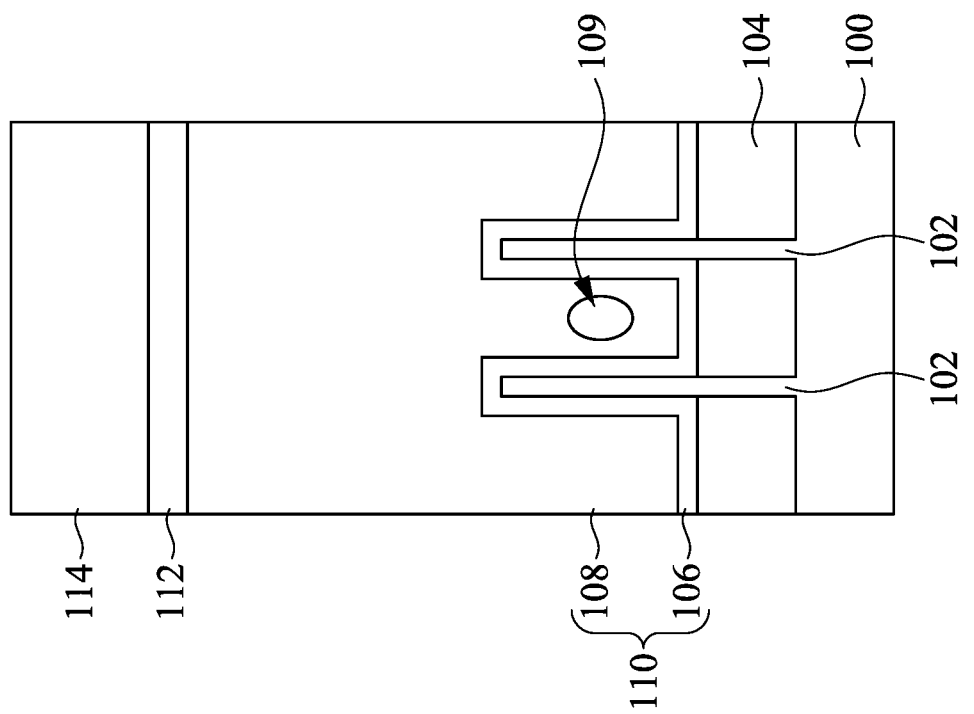

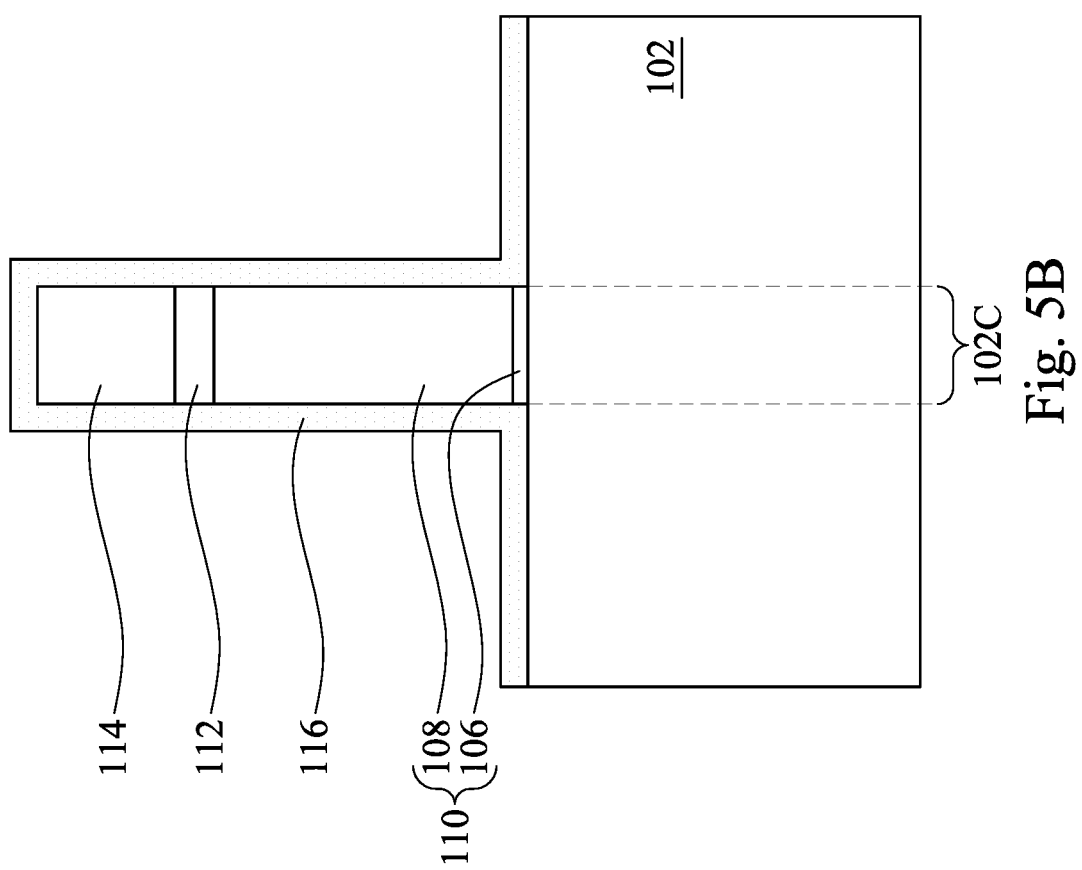

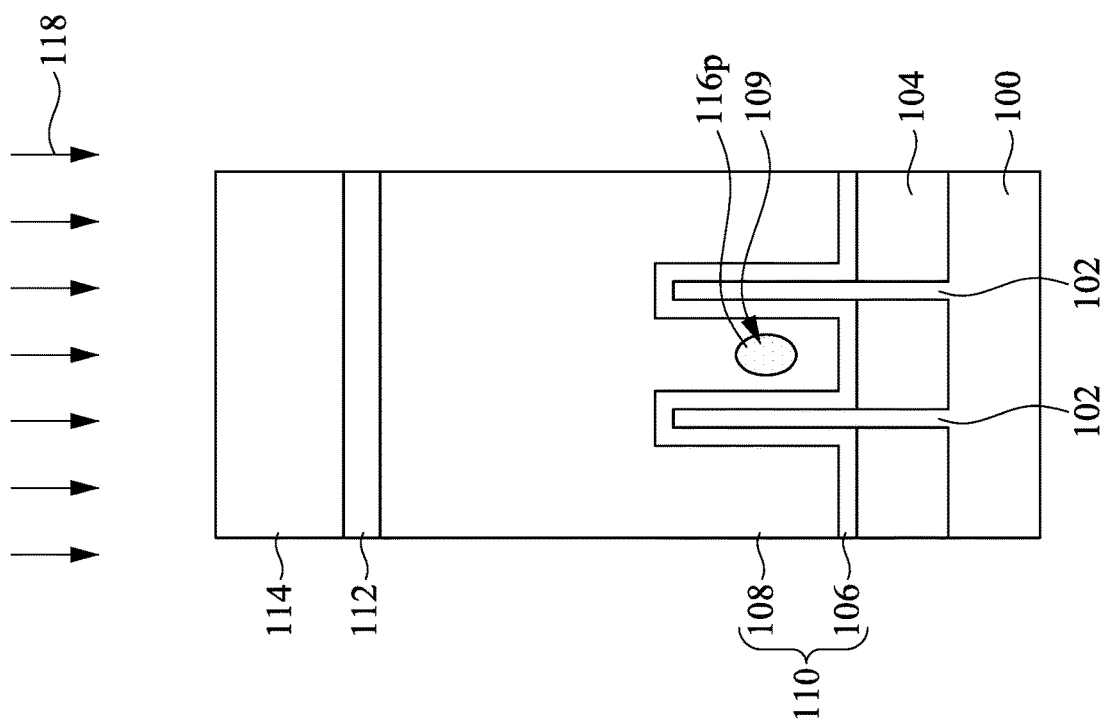

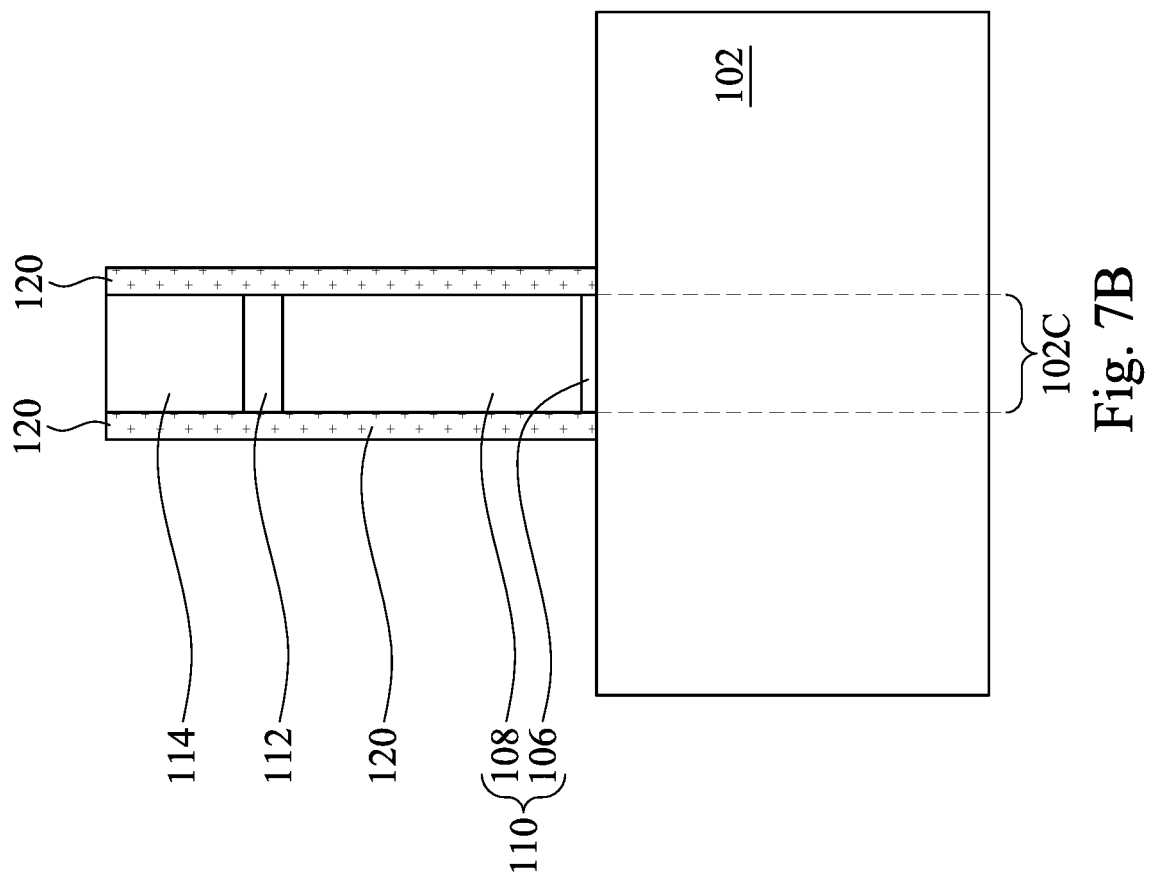

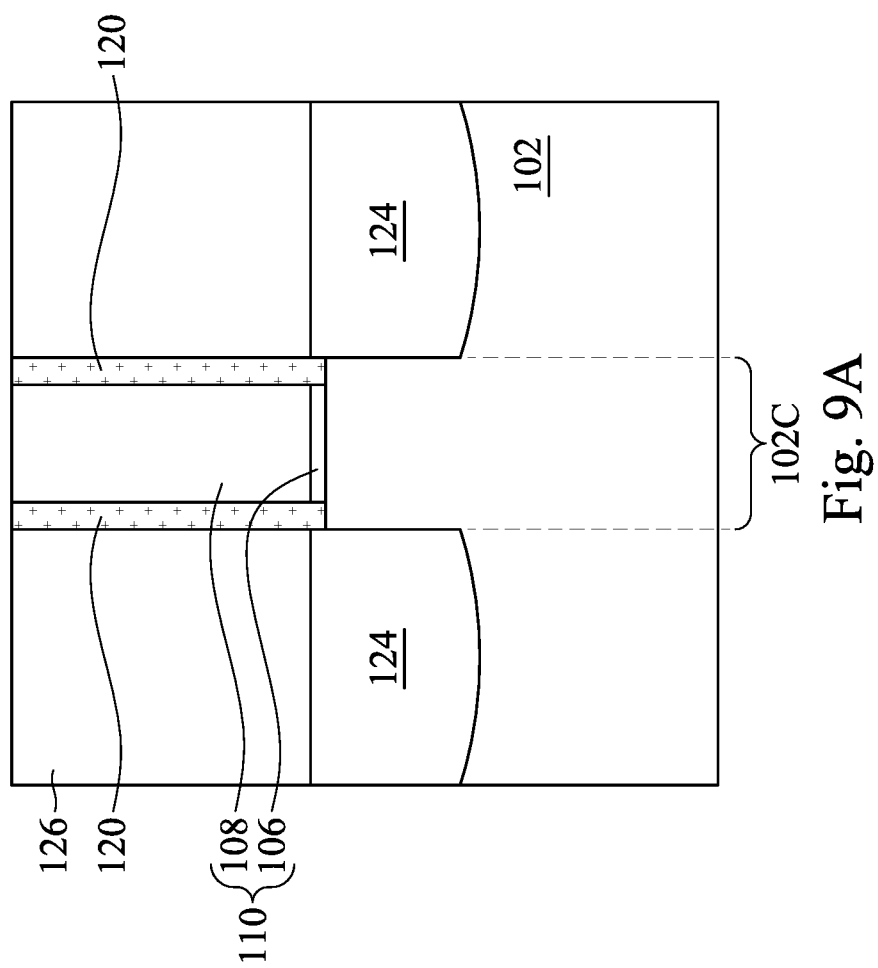

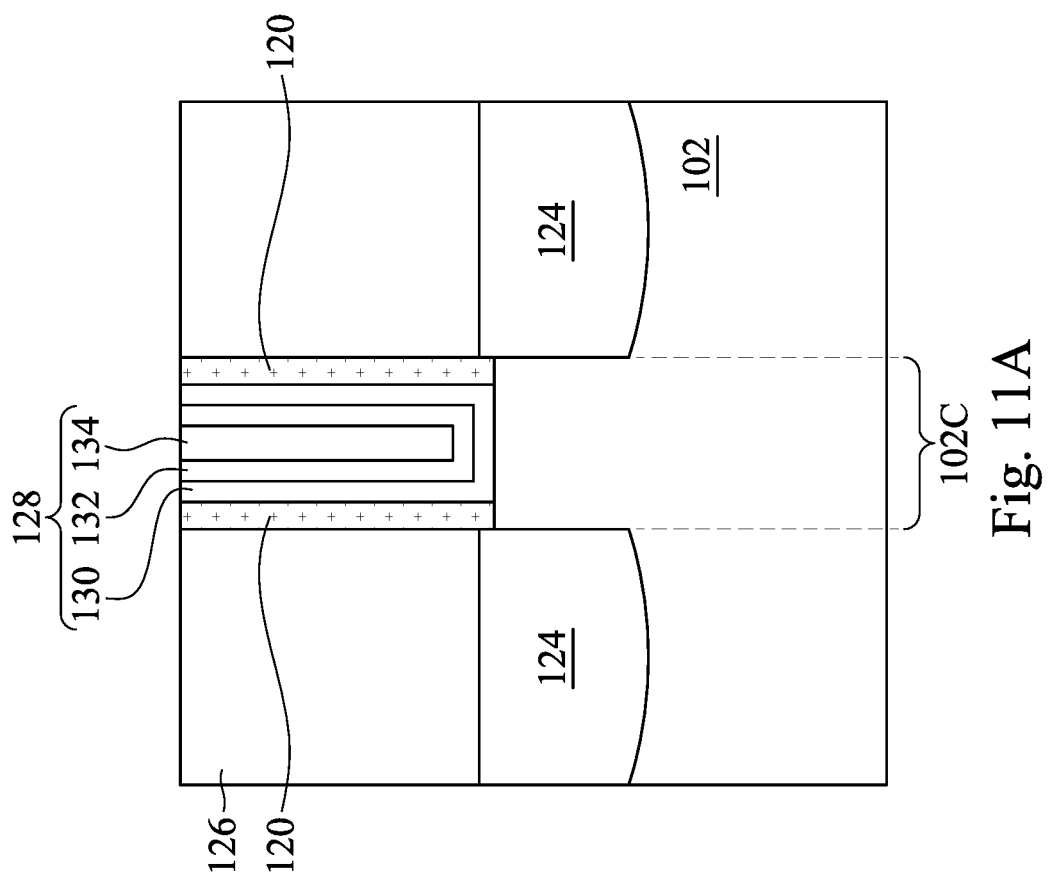

DENSIFIED GATE SPACERS AND FORMATION THEREOF

PRIORITY CLAIM AND CROSS-REFERENCE

This application claims the benefit of U.S. Provisional Application No. 63/175,441, filed on Apr. 15, 2021, which application is hereby incorporated herein by reference in its entirety.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3B, 4C, 5C, 6C, 7C, 8B, 9B, 10B, 11B are cross-sectional views of intermediate stages in fabricating transistors along a first cut, which is a cut in fin-to-fin region along a lengthwise direction of semiconductor fins.

FIGS. 3C, 4D, 5D, 6D, 7D, 8C, 9C, 10C, and 11C are cross-sectional views of intermediate stages in fabricating transistors along a second cut, which is a cut in gate region along a direction perpendicular to the lengthwise direction of semiconductor fins.

FIGS. 4B, 5B, 6B, 7B, 8A, 9A, 10A, 11A are cross-sectional views of intermediate stages in fabricating transistors along a third cut, which is a cut in a semiconductor fin along the lengthwise direction of the semiconductor fin.

DETAILED DESCRIPTION

Figure 1:
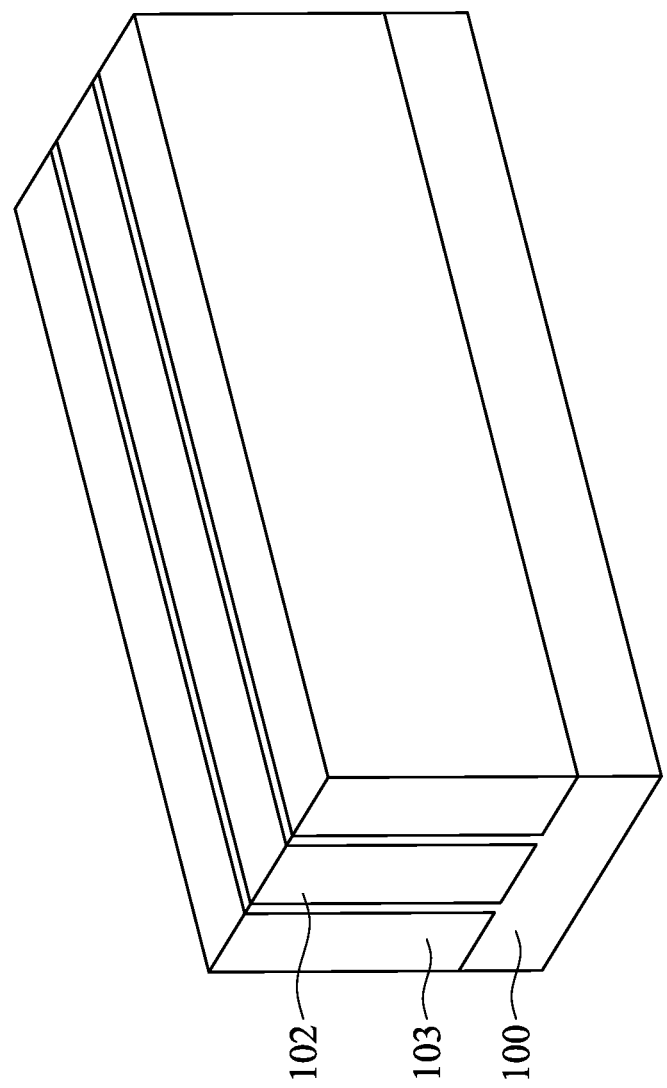
FIGS. 1, 2, 3A, 4A, 5A, 6A, 7A are perspective views of intermediate stages in fabricating transistors in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. Also, some embodiments contemplate aspects used in planar FETs or gate-all-around FETs. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

In advanced transistor technology nodes, such as 7 nm node, 5 nm node, 3 nm node or beyond, the fin-to-fin spaces may be too small to be filled up with dummy gate materials (e.g., polysilicon), which in turn may lead to unfilled voids or seams in the dummy gate structure in the fin-to-fin spaces. In following processing, spacer materials may be deposited in the voids or seams in the dummy gate structure. Therefore, at the dummy gate removal step of gate replacement processing, the spacer material s in the dummy gate structure may block underlying dummy gate materials from being etched, which in turn may leave residues of dummy gate structure (e.g., polysilicon residues) in between the gate spacers.

Therefore, the present disclosure in various embodiments provides a hydrogen treatment to convert an outer portion of the spacer layer to have a different material composition than an original material composition of the spacer layer, such that the converted (or treated) outer portion of the spacer layer outside the void of the dummy gate structure has a different etch selectivity than an unconverted (or untreated) inner portion of the spacer layer within the void of the dummy gate structure. In this way, the dummy gate removal step can use an etchant that etches the unconverted inner portion of the spacer layer at a faster etch rate than etching the converted outer portion of the spacer layer, so that the unconverted inner portion of the spacer layer can be removed during the dummy gate removal step, which in turn aids in completely removing the dummy gate materials.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIGS. 1 through 11C illustrate the perspective views and cross-sectional views of intermediate stages in the formation of transistors in accordance with some embodiments of the present disclosure. The formed transistors include one or more p-type transistors (such as one or more p-type FinFETs) and/or one or more n-type transistors (such as one or more n-type FinFETs) in accordance with some exemplary embodiments. Throughout the various views and illustrative embodiments, like reference numbers are used to designate like elements. It is understood that additional operations can be provided before, during, and after the processes shown by FIGS. 1-11C, and some of the operations described below can be replaced or eliminated, for additional embodiments of the method. The order of the operations/processes may be interchangeable.

FIGS. 1, 2, 3A, 4A, 5A, 6A, 7A are perspective views of intermediate stages in fabricating transistors in accordance with some embodiments of the present disclosure. FIGS. 3B, 4C, 5C, 6C, 7C, 8B, 9B, 10B, 11B are cross-sectional views of intermediate stages in fabricating transistors along a first cut (e.g., cut X1-X1 in FIG. 4A), which is a cut in fin-to-fin region along a lengthwise direction of semiconductor fins. FIGS. 3C, 4D, 5D, 6D, 7D, 8C, 9C, 10C, and 11C are cross-sectional views of intermediate stages in fabricating transistors along a second cut (e.g., cut Y-Y in FIG. 4A), which is a cut in gate region along a direction perpendicular to the lengthwise direction of semiconductor fins. FIGS. 4B, 5B, 6B, 7B, 8A, 9A, 10A, 11A are cross-sectional views of intermediate stages in fabricating transistors along a third cut (e.g., cut X2-X2 in FIG. 4A), which is a cut in a semiconductor fin along the lengthwise direction of the semiconductor fin.

FIG. 1 illustrates a perspective view of an initial structure. The initial structure includes a substrate 100. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 1 also illustrates fins 102 formed in the substrate 100. The fins 102 are semiconductor strips. In some embodiments, the fins 102 may be formed in the substrate 100 by etching trenches in the substrate 100. The etching may be any acceptable etch process, such as a reactive ion etch (RIE), neutral beam etch (NBE), the like, or combinations thereof. The etch may be anisotropic.

The fins may be patterned by any suitable method. For example, the fins 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 102.

Once the fins 102 are formed, an insulation material 103 is formed over the substrate 100 and between neighboring fins 102. The insulation material 103 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used. In the illustrated embodiment, the insulation material 103 is silicon oxide formed by a FCVD process. An anneal process may be performed once the insulation material is formed. In some embodiments, the insulation material 103 is formed such that excess insulation material 103 covers the fins 102. Although the insulation material 103 is illustrated as a single layer, some embodiments may utilize multiple layers. For example, in some embodiments a liner (not shown) may first be formed along a surface of the substrate 100 and the fins 102. Thereafter, a fill material, such as those discussed above may be formed over the liner.

Once the insulation material 103 is deposited over the fins 102, a removal process is applied to the insulation material 103 to remove excess insulation material 103 over the fins 102. In some embodiments, a planarization process such as a chemical mechanical polish (CMP), an etch-back process, combinations thereof, or the like may be utilized. The planarization process exposes the fins 102 such that top surfaces of the fins 102 and the insulation material 103 are level after the planarization process is complete. In embodiments in which a mask remains on the fins 102, the planarization process may expose the mask or remove the mask such that top surfaces of the mask or the fins 102, respectively, and the insulation material 103 are level after the planarization process is complete.

Figure 2:
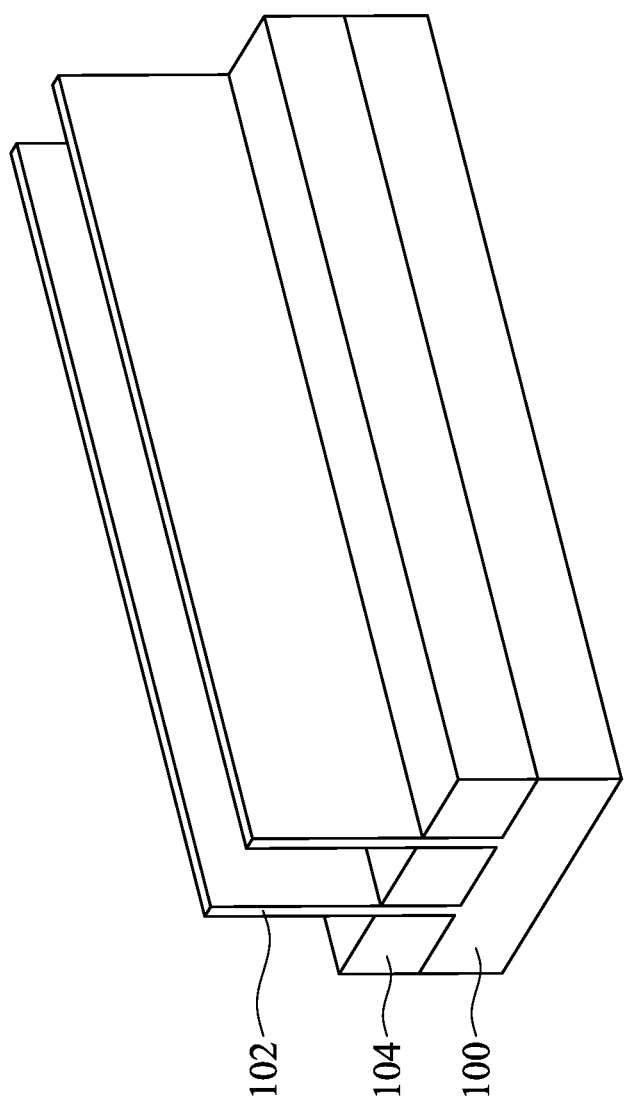

In FIG. 2, the insulation material 103 is recessed to form Shallow Trench Isolation (STI) regions 104. The insulation material 103 is recessed such that upper portions of fins 102 protrude from between neighboring STI regions 104. Further, the top surfaces of the STI regions 104 may have a flat surface as illustrated, a convex surface, a concave surface (such as dishing), or combinations thereof. The top surfaces of the STI regions 104 may be formed flat, convex, and/or concave by an appropriate etch. The STI regions 104 may be recessed using an acceptable etching process, such as one that is selective to the material of the insulation material 103 (e.g., etches the material of the insulation material 103 at a faster rate than the material of the fins 102). For example, an oxide removal using, for example, dilute hydrofluoric (dHF) acid may be used.

The process described with respect to FIGS. 1-2 is just one example of how the fins 102 may be formed. In some embodiments, the fins may be formed by an epitaxial growth process. For example, a dielectric layer can be formed over a top surface of the substrate 100, and trenches can be etched through the dielectric layer to expose the underlying substrate 100. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 102. For example, the fins 102 in FIG. 1 can be recessed, and a material different from the fins 102 may be epitaxially grown over the recessed fins 102. In such embodiments, the fins 102 comprise the recessed material as well as the epitaxially grown material disposed over the recessed material. In an even further embodiment, a dielectric layer can be formed over a top surface of the substrate 100, and trenches can be etched through the dielectric layer. Heteroepitaxial structures can then be epitaxially grown in the trenches using a material different from the substrate 100, and the dielectric layer can be recessed such that the heteroepitaxial structures protrude from the dielectric layer to form the fins 102. In some embodiments where homoepitaxial or heteroepitaxial structures are epitaxially grown, the epitaxially grown materials may be in-situ doped during growth, which may obviate prior and subsequent implantations although in situ and implantation doping may be used together.

Still further, it may be advantageous to epitaxially grow a material in an NFET region different from the material in a PFET. In various embodiments, upper portions of the fins 102 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 2, appropriate wells (not shown) may be formed in the fins 102 and/or the substrate 100. In some embodiments, a P well may be formed in the NFET region, and an N well may be formed in the PFET region. In some embodiments, a P well or an N well are formed in both the NFET region and the PFET region.

Figure 3A:
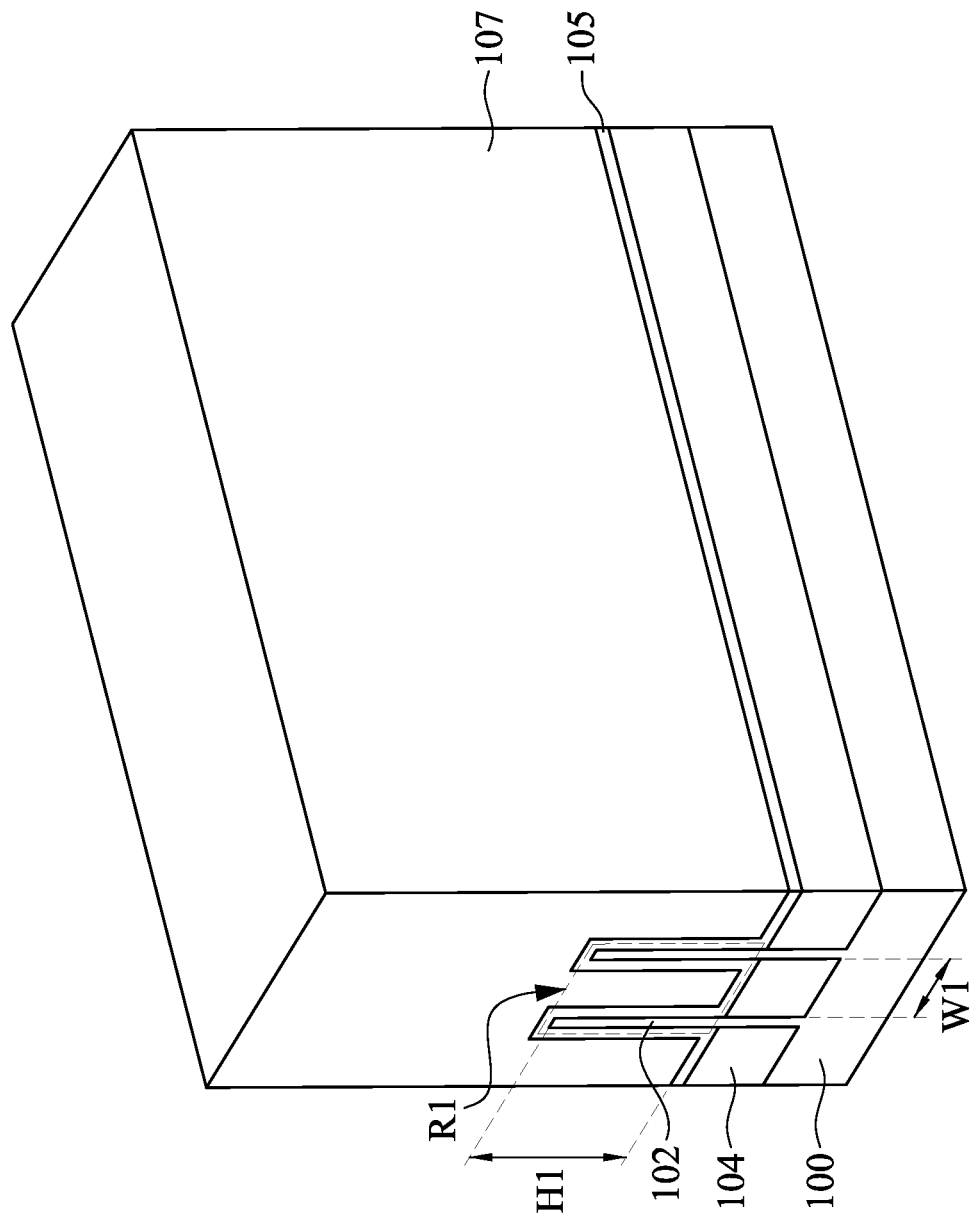
Figure 3B:
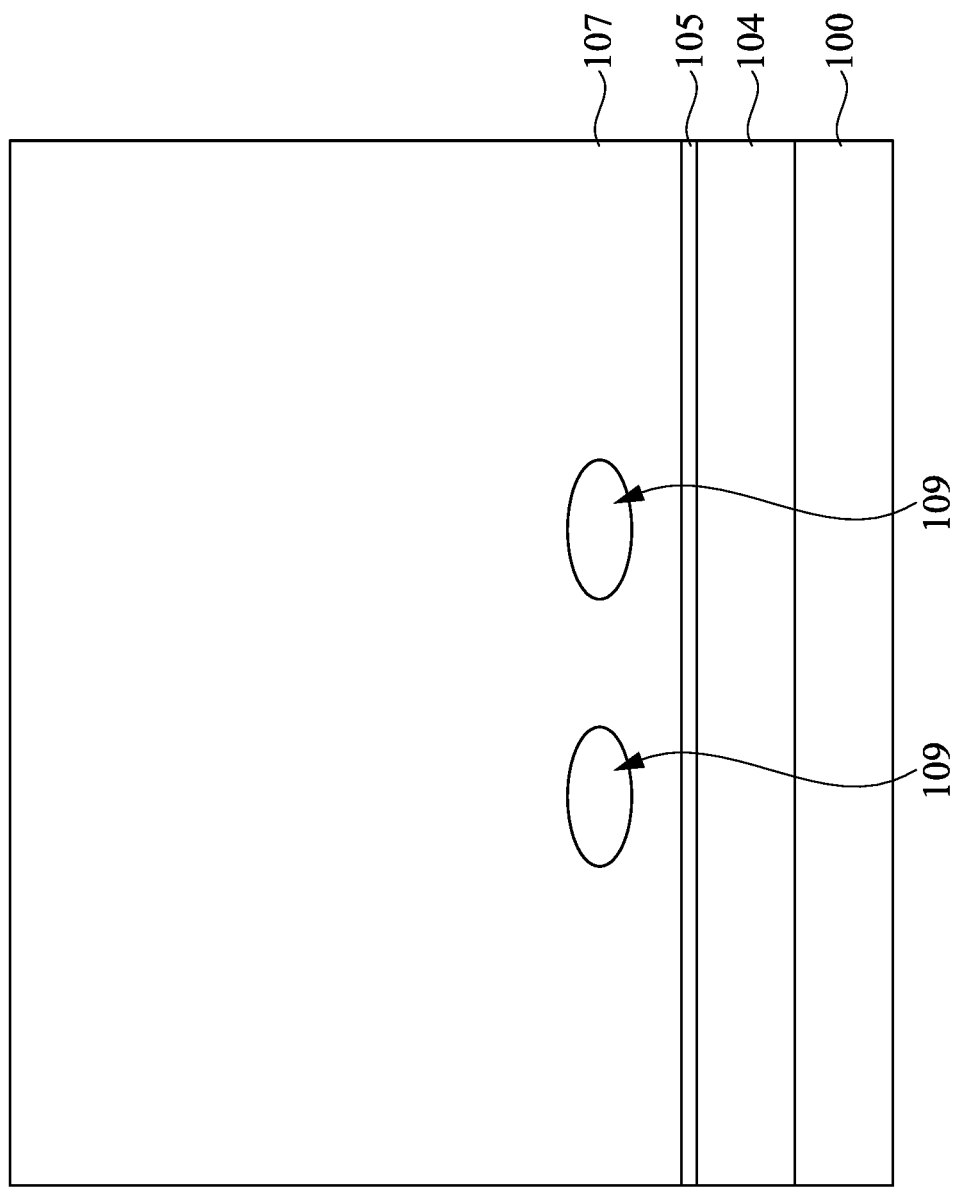
Figure 4A:
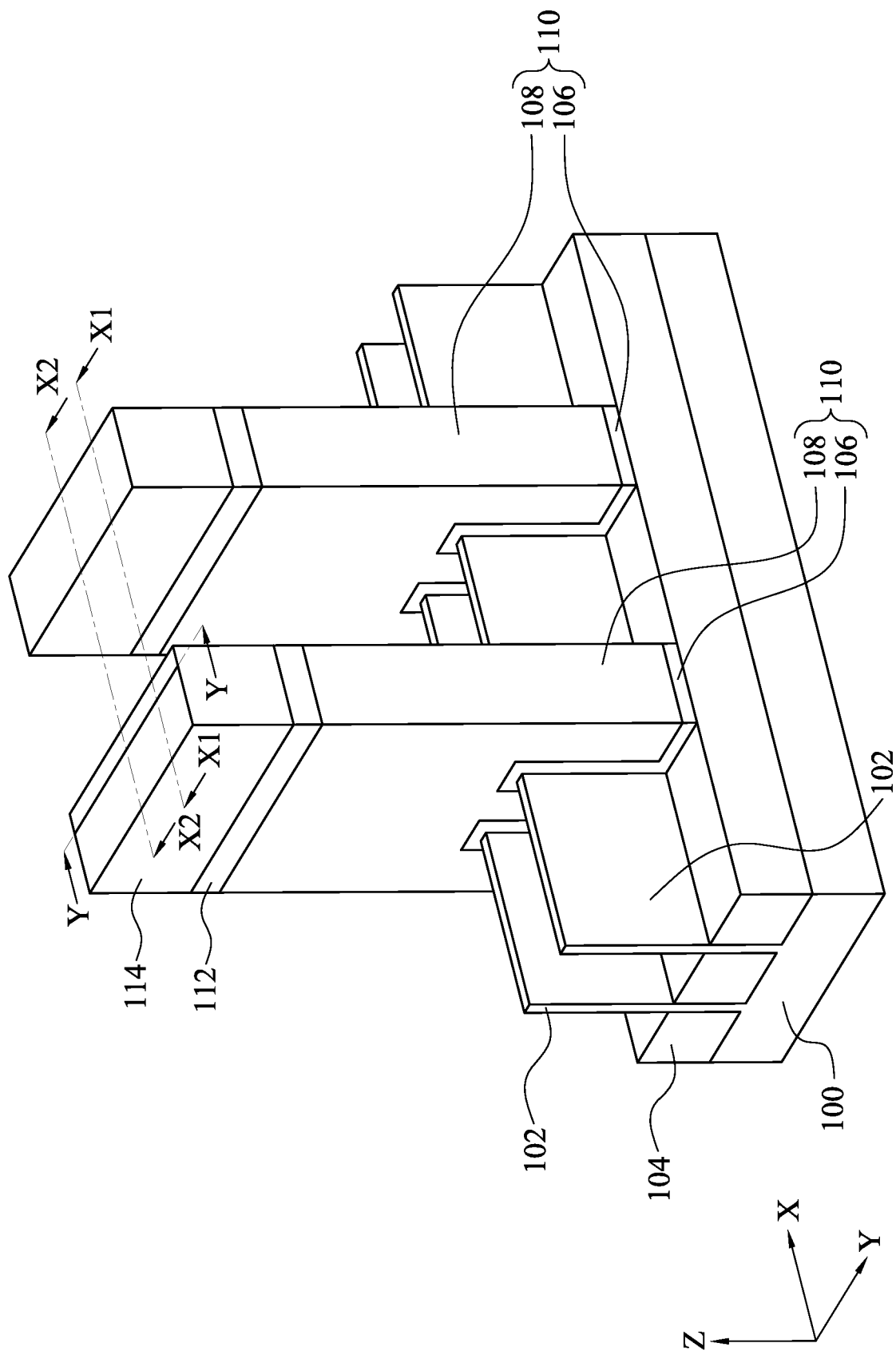

In FIGS. 3A and 3B, a dummy dielectric layer 105 is formed on the fins 102. The dummy dielectric layer 105 may be, for example, silicon oxide, silicon nitride, a combination thereof, or the like, and may be deposited or thermally grown according to acceptable techniques. A dummy gate layer 107 is then formed over the dummy dielectric layer 105. The dummy gate layer 107 may be deposited over the dummy dielectric layer 105 and then planarized, such as by a CMP. The dummy gate layer 107 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 107 may be deposited by physical vapor deposition (PVD), CVD, sputter deposition, or other techniques for depositing the selected material. The dummy gate layer 107 may be made of other materials that have a high etching selectivity from the etching of isolation regions, e.g., the STI regions 104 and/or the dummy dielectric layer 105.

Because the fin-to-fin W1 distance between neighboring semiconductor fins 102 is small (e.g., from about 8 nm to about 13 nm), and the fin height H1 extending from the STI regions 104 is high (e.g., from about 50 to about 55 nm), the fin-to-fin space R1 between neighboring semiconductor fins 102 has a high aspect ratio (i.e., ratio of fin height H1 to fin-to-fin distance W1), e.g., in a range from about 50:13 to about 55:8. The high aspect ratio may result in unfilled voids 109 in the dummy gate layer 107 in the fin-to-fin space R1, as illustrated in FIGS. 3B and 3C.

In FIGS. 4A-4D, a mask pattern is formed over the dummy gate layer 107 to aid in the patterning. In some embodiments, a hard mask pattern includes a bottom mask 112 over the dummy gate layer 107 and a top mask 114 over the bottom mask 112. The hard mask pattern is made of one or more layers of $SiO_2$, SiCN, SiON, $Al_2O_3$, SiN, or other suitable materials. In certain embodiments, the bottom mask 112 includes silicon nitride, and the top mask 114 includes silicon oxide. By using the mask pattern as an etching mask, the dummy gate layer 107 is patterned into a plurality of separate dummy gate electrodes 108, and the dummy dielectric layer 105 is patterned into a plurality of separate dummy gate dielectric layers 106. A dummy gate electrode 108 and an underlying dummy gate dielectric layer 106 collectively serve as a dummy gate structure 110 extending across channel regions 102C of the semiconductor fins 102. The pattern of the masks 112, 114 may be used to physically separate each of the dummy gate structures 110 from adjacent dummy gate structures 110. The dummy gate structures 110 may also have a lengthwise direction substantially perpendicular to the lengthwise direction of respective semiconductor fins 102.

In FIGS. 5A-5D, a spacer layer 116 is formed as a blanket layer over the substrate 100. In some embodiments, the spacer layer 116 may have a single-layer structure, wherein an entirety of the spacer layer 116 is made of a same material (e.g., porous SiCOH). The spacer layer 116 may be formed as a substantially conformal layer, and hence a thickness T1 of the vertical portions of the spacer layer 116 on sidewalls of the semiconductor fins 102 and the dummy gate structure 110 is close to a thickness T2 of the horizontal portion of the spacer layer 116. For example, thicknesses T1 and T2 may have a difference smaller than about 20 percent of thickness T2.

Figure 5A:
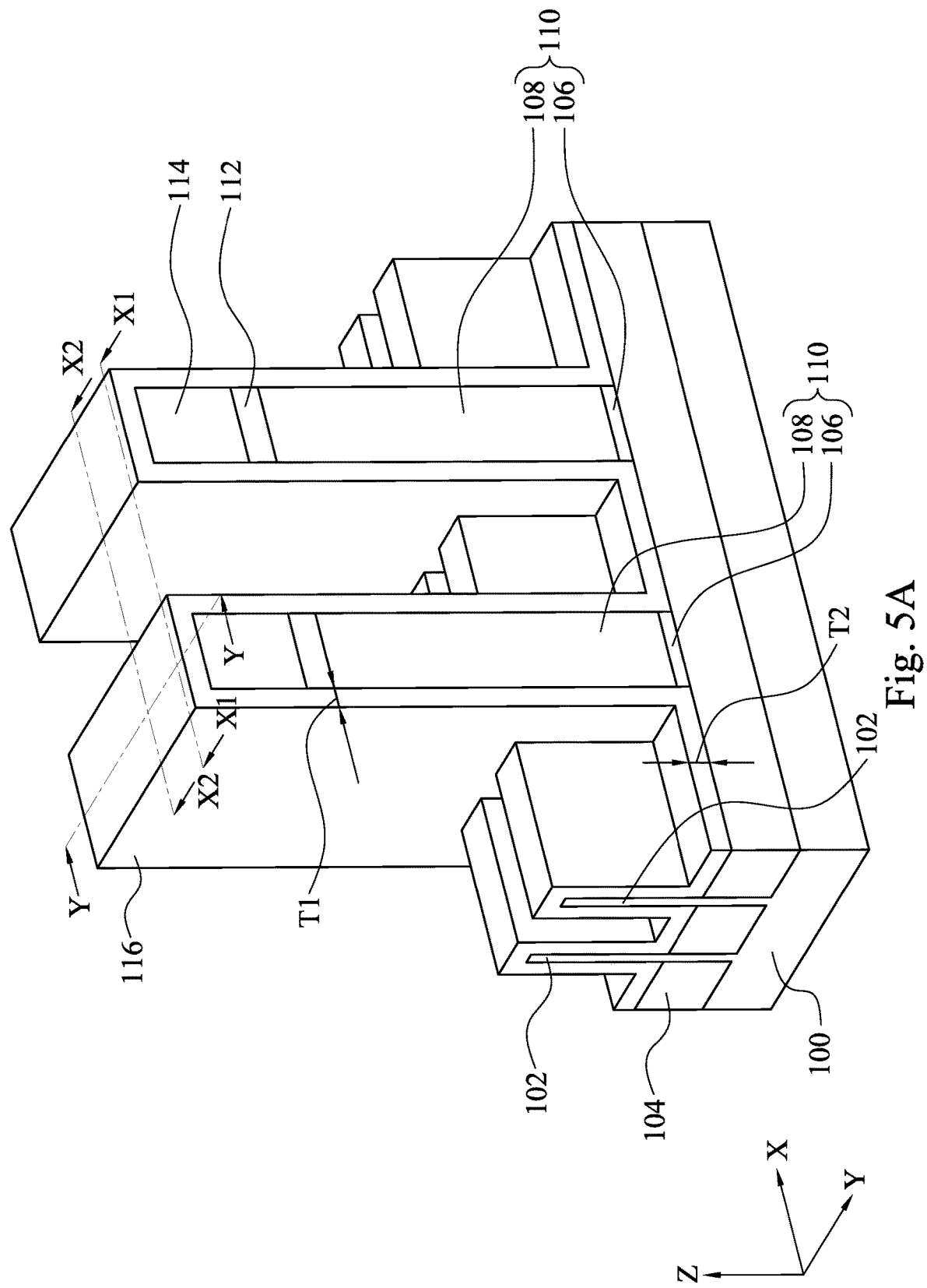
Figure 5C:
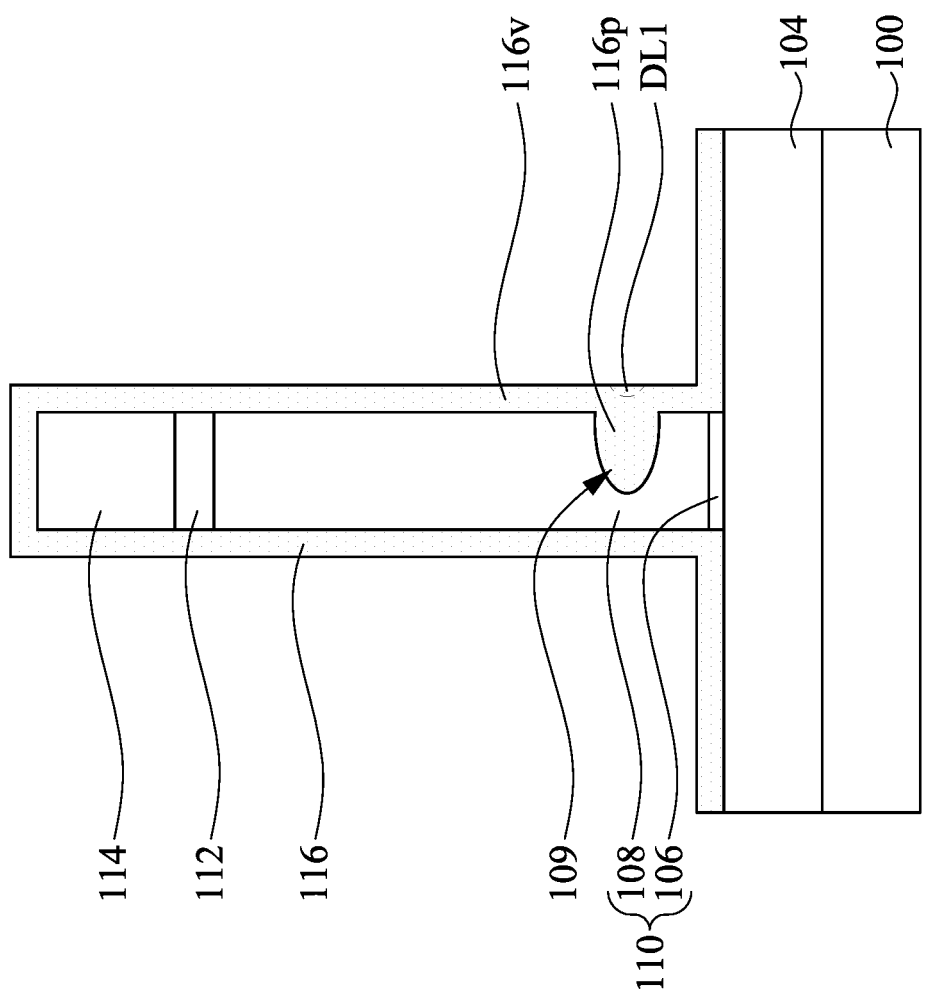
Figure 5D:
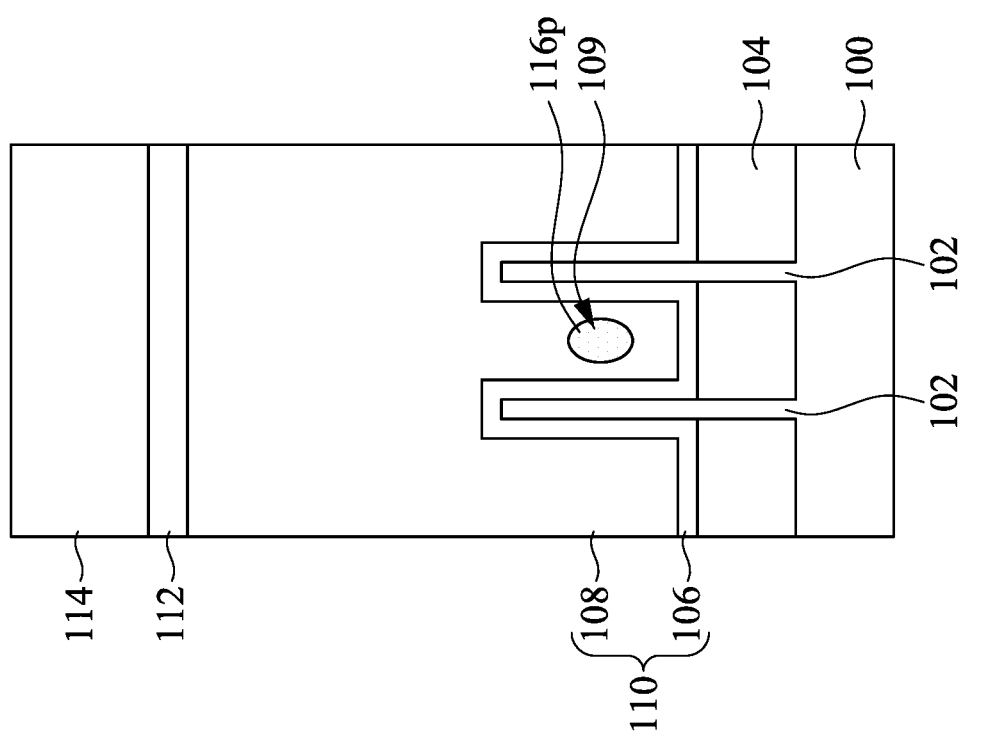

As illustrated in FIG. 5C, the spacer material may be deposited into and overfill the void 109 of the dummy gate electrode 108, so that the spacer layer 116 has a protruding portion 116p laterally protruding from a vertical portion 116v of the spacer layer 116. The protruding portion 116p is localized to the fin-to-fin region, as illustrated in FIG. 5D. As illustrated in FIGS. 5C and 5D, a portion of the dummy gate electrode 108 is below the protruding portion 116p of the spacer layer 116. As a result, in a following dummy gate removal etching, the portion of the dummy gate below the protruding portion 116p of the spacer layer 116 might be unremoved, if the dummy gate removal etching step uses an etchant that attacks the material of the dummy gate electrode 108 but hardly attacks the material of the spacer layer 116.

In some embodiments, the spacer layer 116 is a porous SiCOH film that is deposited by CVD or PECVD technique. SiCOH is a low-k dielectric material having a dielectric constant lower than a dielectric constant of silicon oxide ($SiO_2$), which is about 3.9-4.0. SiCOH may be referred to as "organosilicate glass" or "OSG". Sometimes additional materials such as F are also present in the SiOH film, these embodiments are alternatives to the example embodiments. In one example process, the porous OSG films may be deposited in a chemical vapor deposition chamber ("CVD"). An inert gas such as argon (Ar) or helium (He) is provided to the vapor deposition chamber which houses a wafer support or platen holding the wafer. Reactive gases are introduced into the chamber and used as sources for the film elements, for example, trimethyl silane $(CH_3)_3SiH$ or "TMS", and $CO_2$ as a carrier gas may be used as reactive gases. Other reactive gases are known for forming SiCOH films such as organosilanes and organosilaxanes. Chemical vapor deposition may be used, alternatively plasma enhanced chemical vapor deposition ("PECVD") may be used. Plasma energy is used to activate the formation of a film layer on the wafer substrate. A sacrificial porogen is also included. The porogen is an organic material and may be a cyclic hydrocarbon, for example, that decomposes during the cure cycle. UV curable porogens for organosilicate glass are known and commercially available. Thermal curable porogens are also known and also may be used. In an embodiment, a UV curable porogen is used. In an alternative embodiment, a thermally curable porogen may be used. A UV cure is able to remove the porogen on the substrate as does the thermal cure, the UV cure also contributes increased efficiency for porogen removal and better cross-linking. The porogens decompose in the initial portion of the cure time, and are removed from the dielectric material, leaving pores in the SiCOH film, thus forming a porous SiCOH film 116.

When the spacer layer 116 is a porous SiCOH film, a composition of the spacer layer 116, measured by X-ray photoelectron spectroscopy (XPS), includes about 27-35 atomic % Si, about 39-50 atomic % carbon, and about 15-30 atomic % oxygen. In that case, the carbon atomic percentage in the porous SiCOH film is greater than the oxygen atomic percentage and the silicon atomic percentage in the porous SiCOH film. It is noted that hydrogen is usually unobservable in XPS measurement, and thus the hydrogen atomic percentage is omitted in this disclosure. In some embodiments, the porous SiCOH film is nitrogen-free. As measured by XPS, the porous SiCOH film has zero nitrogen atomic concentration. In some embodiments, the porous SiCOH film has a dielectric constant in a range from about 3.5 to about 3.7 (e.g., about 3.6), and a density in range from about 1.5 g/cm³ to about 1.8 g/cm³ (e.g., about 1.7 g/cm³). In some embodiments, the porous SiCOH film 116 is a Si—$CH_3$ rich film. For example, a number of silicon methyl (Si—$CH_3$) bonds in the porous SiCOH film 116 is greater than a number of other bonds (e.g., Si—O bonds, Si—C—Si bonds, or other bonds) in the porous SiCOH film 116. Stated differently, a ratio of a number of Si—$CH_3$ bonds to a number of Si—C—Si bonds in the porous SiCOH film 116 is greater than 1:1. The Si—$CH_3$ rich composition contributes to decreased density and increased etch rate in following etching process (e.g., dummy gate removal etching).

In FIG. 5C, the spacer layer 116 has a vertical portion 116$v$ on a sidewall of the dummy gate structure 110. In the depicted embodiment, the vertical portion 116$y$ has an outer sidewall that extends linearly in a direction vertical to a major surface of the substrate 100. However, in some other embodiments, the outer sidewall of the vertical portion 116$v$ may have a recessed region (as indicated by the dash line DL1), because the shape of vertical portion 116$v$ may be affected by the topography of dummy gate sidewall that has a void 109.

In FIGS. 6A-6D, a densification treatment 118 is performed to convert an outer portion of the porous spacer layer 116 (e.g., porous SiCOH film) into a densified spacer layer 119, e.g., by breaking Si—$CH_3$ bonds in the SiCOH film, while leaving the protruding portion 116$p$ in the void 109 of the dummy gate structure 110 unconverted or undensified. Therefore, the densified spacer layer 119 outside the void 109 of the dummy gate structure 110 have a different material composition and hence a different etch selectivity than the undensified spacer portion 116$p$ in the void 109 of the dummy gate structure 110. In this way, a following dummy gate removal step can use an etchant that etches the undendified spacer portion 116$p$ at a faster etch rate than etching the densified spacer layer 119, which in turn aids in completely removing the dummy gate structure 110 in the following dummy gate removal step.

In some embodiments, the densification treatment 118 is a hydrogen radical treatment, in which outer surfaces of the porous spacer layer 116 are exposed to hydrogen radicals, while the inner surfaces of the porous spacer layer 116 (e.g., surfaces of the protruding portion 116$p$ in the gate void 109) are not exposed to hydrogen radicals. Hydrogen radicals have kinetic energy sufficient to break Si—$CH_3$ bonds. Therefore, the hydrogen radical treatment 118 leads to a decrease in a number of Si—$CH_3$ bonds in the SiCOH film. Therefore, after the hydrogen radical treatment 118 is complete, a number of silicon methyl (Si—$CH_3$) bonds in the densified SiCOH film 119 is less than a number of other bonds (e.g., Si—C—Si bonds, Si—O bonds, or other bonds) in the densified SiCOH film 119. Stated differently, a ratio of a number of Si—$CH_3$ bonds to a number of Si—C—Si bonds in the densified SiCOH film 119 is less than 1:1.

Moreover, breaking of the Si—$CH_3$ bonds may also lead to formation of Si—C—Si bonds. Therefore, the hydrogen radical treatment 118 leads to not only a decrease in a number of Si—$CH_3$ bonds, but also an increase in a number of Si—C—Si bonds, which in turn results in an increase in the density of the SiCOH film. As a result, the hydrogen radical treatment 118 can convert the porous SiCOH film 116 into a densified or "dense" SiCOH film 119 that has a greater density than the porous SiCOH film 116. For example, when a porous SiCOH film 116 having a density in a range from about 1.5 g/cm³ to about 1.8 g/cm³ (e.g., about 1.7 g/cm³) is subjected to the hydrogen radical treatment 118, the porous SiCOH film 116 can be converted into a densified SiCOH film 119 having a density in a range from about 2.2 g/cm³ to about 2.4 g/cm³ (e.g., about 2.3 g/cm³). In some embodiments where the porous SiCOH film having density of about 1.7 g/cm³ is densified to have a density of about 2.3 g/cm³, the hydrogen radical treatment 118 results in a density increasing percentage of about 35.3%.

Moreover, a decrease in a number of Si—$CH_3$ bonds may also lead to an increase in the dielectric constant of the SiCOH film. As a result, the hydrogen radical treatment 118 may convert the low-k SiCOH film 116 into a "high-k" SiCOH film 119 that has a greater dielectric constant than the low-k SiCOH film 116. For example, when a low-k SiCOH film 116 having a dielectric constant in a range from about 3.5 to about 3.7 (e.g., about 3.6), which is less than a dielectric constant of $SiO_2$, is subjected to the hydrogen radical treatment 118, the low-k SiCOH film 116 can be converted into a high-k SiCOH film 119 having a dielectric constant in a range from about 4.2 to about 4.6 (e.g., about 4.4), which is higher than the dielectric constant of $SiO_2$. In some embodiments where the low-k SiCOH film having a original dielectric constant of about 3.6 is converted to have a final dielectric constant of about 4.4, the hydrogen radical treatment 118 results in a dielectric constant increasing percentage of about 22.2%.

In some embodiments, the hydrogen radical treatment 118 results in an increase in silicon atomic percentage in SiCOH film, a decrease in carbon atomic percentage in SiCOH film, and an increase in oxygen atomic percentage in SiCOH film. For example, after the hydrogen radical treatment 118 is complete, a composition of the densified SiCOH film 119, measured by XPS, includes about 36-39 atomic % Si, about 10-20 atomic % carbon, and about 35-45 atomic % oxygen. Therefore, after the hydrogen radical treatment 118 is complete, the carbon atomic percentage in the densified SiCOH film 119 may be less than the oxygen atomic percentage and silicon atomic percentage in the densified SiCOH film 119. It is noted that hydrogen is usually unobservable in XPS measurement, and thus the hydrogen atomic percentage is omitted in this disclosure. In some embodiments, the densified SiCOH film is nitrogen-free. As measured by XPS, the densified SiCOH film has zero nitrogen atomic concentration.

Because the protruding portion 116p of the porous SiCOH film 116 is not exposed to the hydrogen radicals and thus remains unconverted, the unconverted porous SiCOH portion 116p has a different material composition than the densified SiCOH film 119. For example, as measured by XPS, the carbon atomic percentage of the densified SiCOH film 119 (e.g., in a range from 10% to about 20%) is less than a carbon atomic percentage of the unconverted porous SiCOH portion 116p (e.g., in a range from 39% to about 50%), the silicon atomic percentage of the densified SiCOH film 119 (e.g., in a range from 36% to about 39%) is greater than a silicon atomic percentage of the unconverted porous SiCOH portion 116p (e.g., in a range from 27% to about 35%), and the oxygen atomic percentage of the densified SiCOH film 119 (e.g., in a range from 35% to about 45%) is greater than an oxygen atomic percentage of the unconverted porous SiCOH portion 116p (e.g., in a range from 15% to about 30%). Moreover, the density of the densified SiCOH film 119 (e.g., in a range from about 2.2 g/cm$^3$ to about 2.4 g/cm$^3$) is greater than the density of the unconverted porous SiCOH portion 116p (e.g., in a range from about 1.5 g/cm$^3$ to about 1.8 g/cm$^3$), and the dielectric constant of the densified SiCOH film 119 (e.g., in a range from about 4.2 to about 4.6) is greater than the dielectric constant of the unconverted porous SiCOH portion 116p (e.g., in a range from about 3.5 to about 3.7).

In some embodiments, the hydrogen radical treatment 118 is performed at a temperature in a range from about 500° C. to about 600° C., at a pressure less than about 1 torr, for a duration time in a range from about 10 seconds to about 120 seconds. If the process conditions of the hydrogen radical treatment 118 are out of the above selected ranges, fin sidewall spacers and gate sidewall spacers subsequently formed from the densified SiCOH film 119 may undesirably have different film qualities.

Figure 6A:
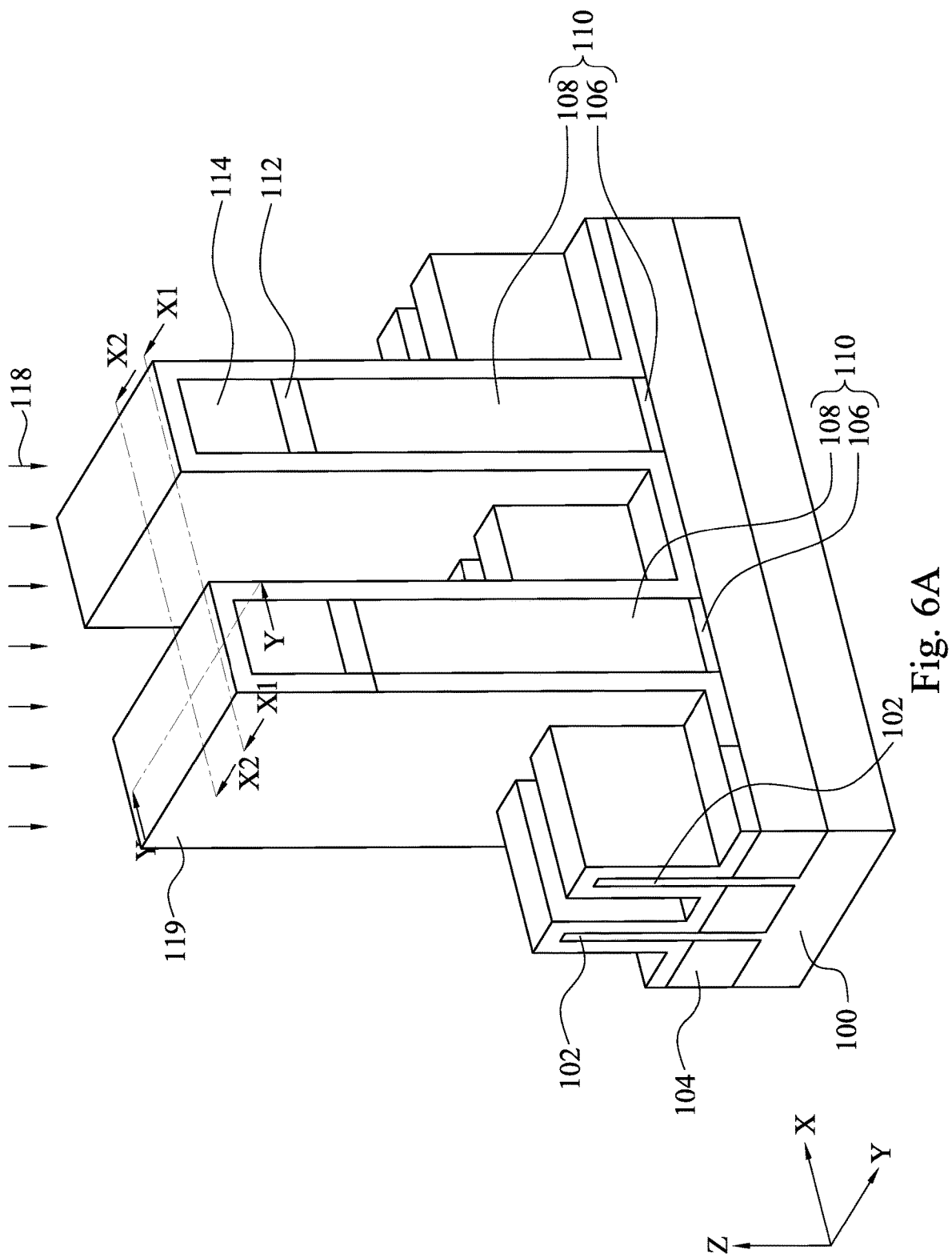
Figure 6B:
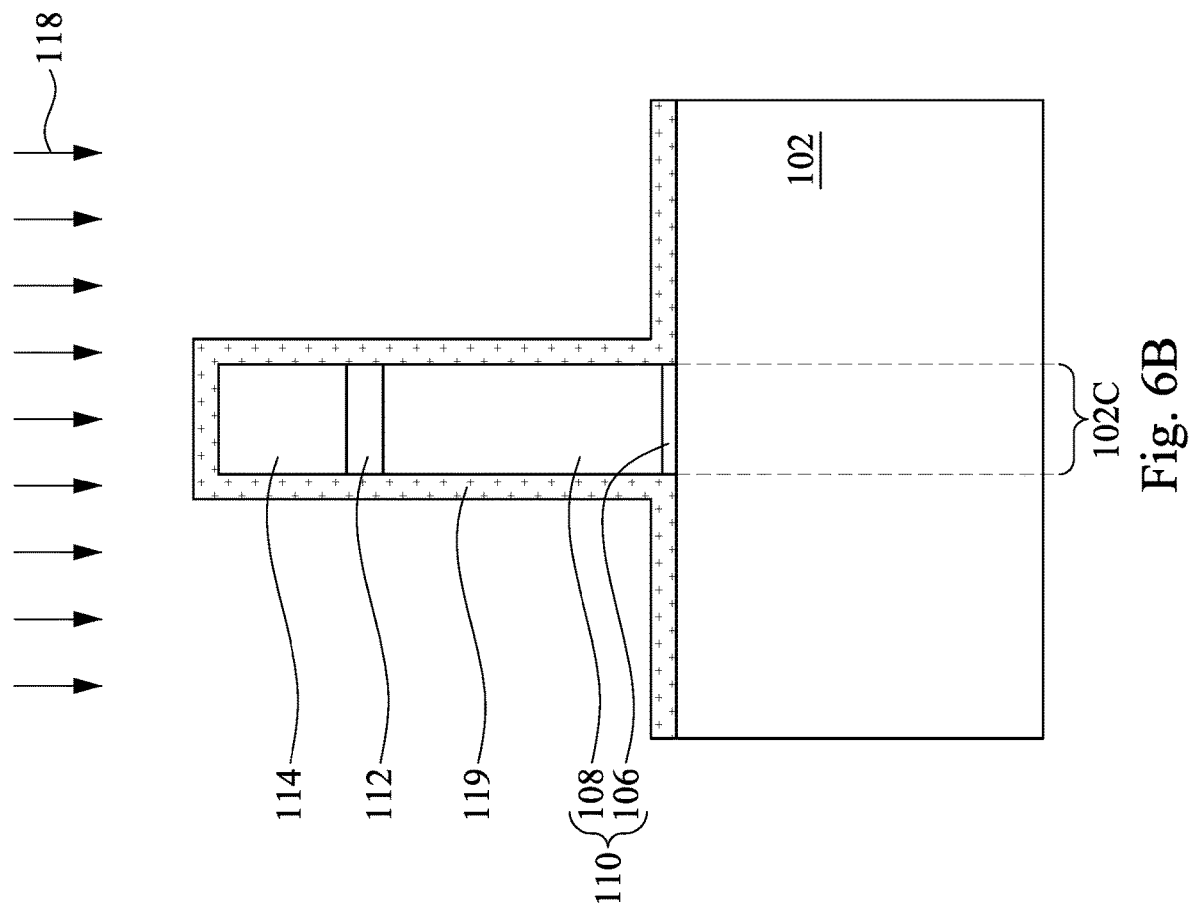
Figure 6C:
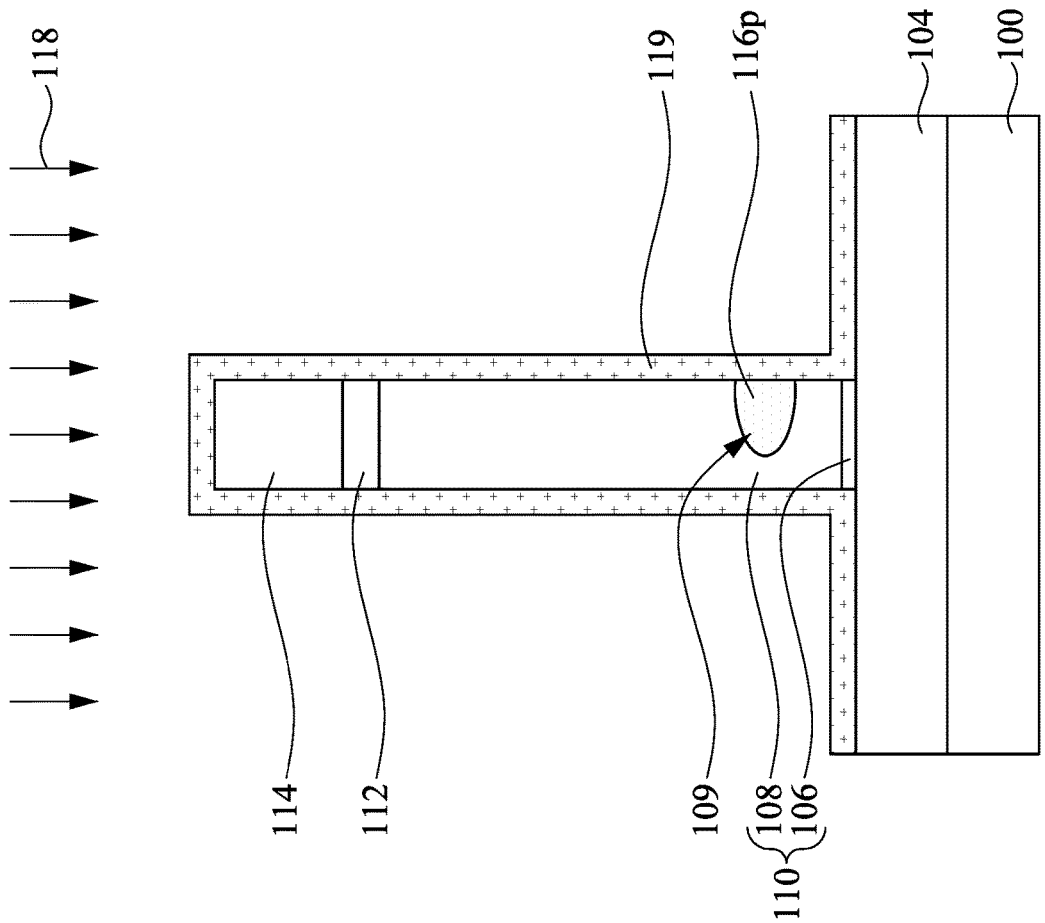
Figure 6E:
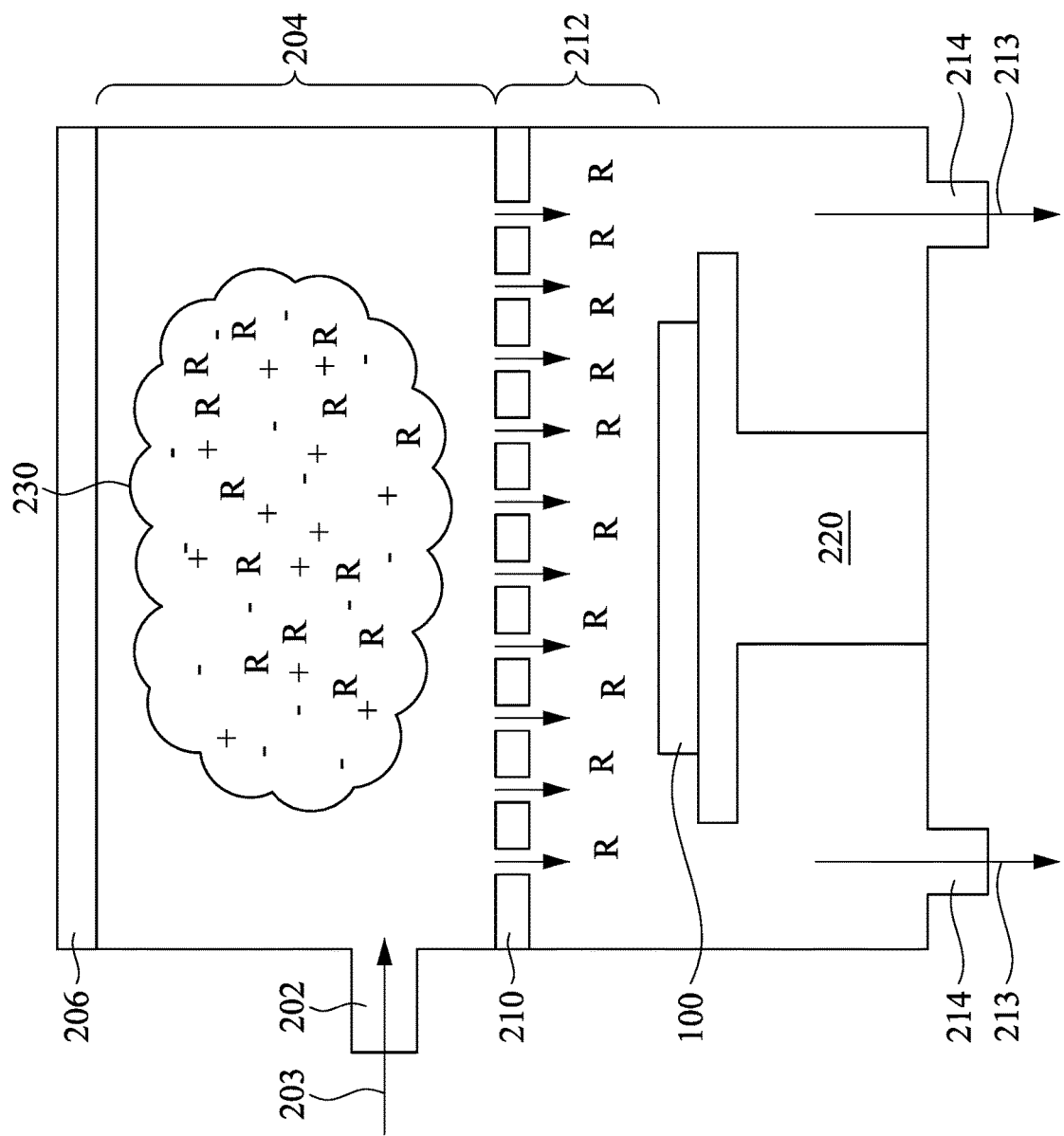
FIG. 6E is a side view of an example processing tool used for performing a hydrogen radical treatment according to some embodiments of the present disclosure.

FIG. 6E illustrates an example processing tool used for performing the hydrogen radical treatment 118 according to some embodiments of the present disclosure. The wafer 100 is placed on a supporting chuck 220 in a treatment region 212 of the processing tool. The processing tool includes an inlet 202, which allows one or more process gases to be flowed into the tool as indicated by arrow 203. The process gas may include a precursor gas, such as hydrogen gas ($H_2$) for producing hydrogen radicals (H*). The process gas may further include a carrier gas such as inert gas like helium (He) or argon (Ar).

The hydrogen-containing process gas flows into a plasma generation region 204, and a hydrogen-containing plasma 230 are generated from the process gas in the plasma generation region 204. Any method of generating plasma from the process gas may be used. For example, in FIG. 6E, the hydrogen-containing plasma 230 are generated between two electrodes 206 and 210. The top electrode 206 may be an inductively coupled plasma (ICP) coil. Other plasma generation methods may be used in other embodiments.

In some embodiments where the process gas includes hydrogen gas ($H_2$), the hydrogen gas may be substantially converted to hydrogen radicals (H*). However, not all of the hydrogen gas may convert to hydrogen radicals. For example, hydrogen ions, such as hydrogen cations (H+) and hydrogen anions (H−), may also be formed in the conversion process. Hydrogen ions that reach the treatment region 212 (e.g., where the substrate 100 is located) may potentially cause undesired reactions with the porous SiCOH film on the substrate 100. As such, the bottom electrode 210 may comprise a selective modulation device (e.g., an ion filter), which spatially separates the plasma generation region 204 (e.g., where the plasma is generated) from the treatment region 212. The selective modulation device 210 can attract ions and prevent the ions from exiting the plasma generation region 204 and reaching the treatment region 212. Excess gases may be pumped out of the process chamber through one or more exhausts 214 as illustrated by arrows 213.

In some embodiments, the selective modulating device of the bottom electrode 210 may comprise an electrically charged grating that acts as a barrier to the movement of charged ions "+"/"−" from a plasma while allowing uncharged plasma "R" (e.g., hydrogen radicals) to pass through the selective modulation device 210. In some embodiments, the selective modulation device 210 can prevent the charged plasma ions (e.g., positively charged ions "+" or negatively charged ions "−") from passing by either repelling the charged plasma ions or else by attracting the charged plasma ions. However, any suitable device that can separate radicals from a plasma may be utilized. In embodiments in which inert gases (e.g., Ar and/or He) pass through the inlet 202, the selective modulation device 210 allows the inert gases to pass through and eventually into the treatment region 212.

Once the plasma 230 has been generated, the selective modulation device 210 allows the radical components "R" to pass through the selective modulation device 210 into the treatment region 212, where the substrate 100 is located. Additionally, the selective modulation device 210 substantially prevents the movement of the positive ions "+" and also the negative ions "−" from entering the treatment region 212. In effect, the selective modulation device 210 is utilized to filter the positive ions "+" and the negative ions "−" from the plasma 230, thereby allowing only the radical components "R" (e.g., hydrogen radicals) to be used in the hydrogen radical treatment 118 as discussed previously with respect to FIGS. 6A-6D.

In FIGS. 7A-7D, the densified spacer layer 119 is patterned to form gate spacers 120 on opposite sidewalls of the dummy gate structure 110, and fin spacers 122 on opposite sidewalls of the semiconductor fins 102. The densified spacer layer 119 may be patterned by a dry etching process using a fluorine-based etchant (e.g., $CF_4$, $C_2F_6$, $C_3F_8$, $CHF_3$, or $CH_2F_2$). The patterning has an anisotropic effect, so that the horizontal portions of the densified spacer layer 119 are removed from top surfaces of the dummy gate structures 110 and the semiconductor fins 102, while some vertical portions of the densified spacer layer 119 on the sidewalls of the dummy gate structures 110 remain to form gate spacers 120, and some vertical portions of the densified spacer layer 119 on the sidewalls of semiconductor fins 102 remain to form fin spacers 122.

Figure 7A:
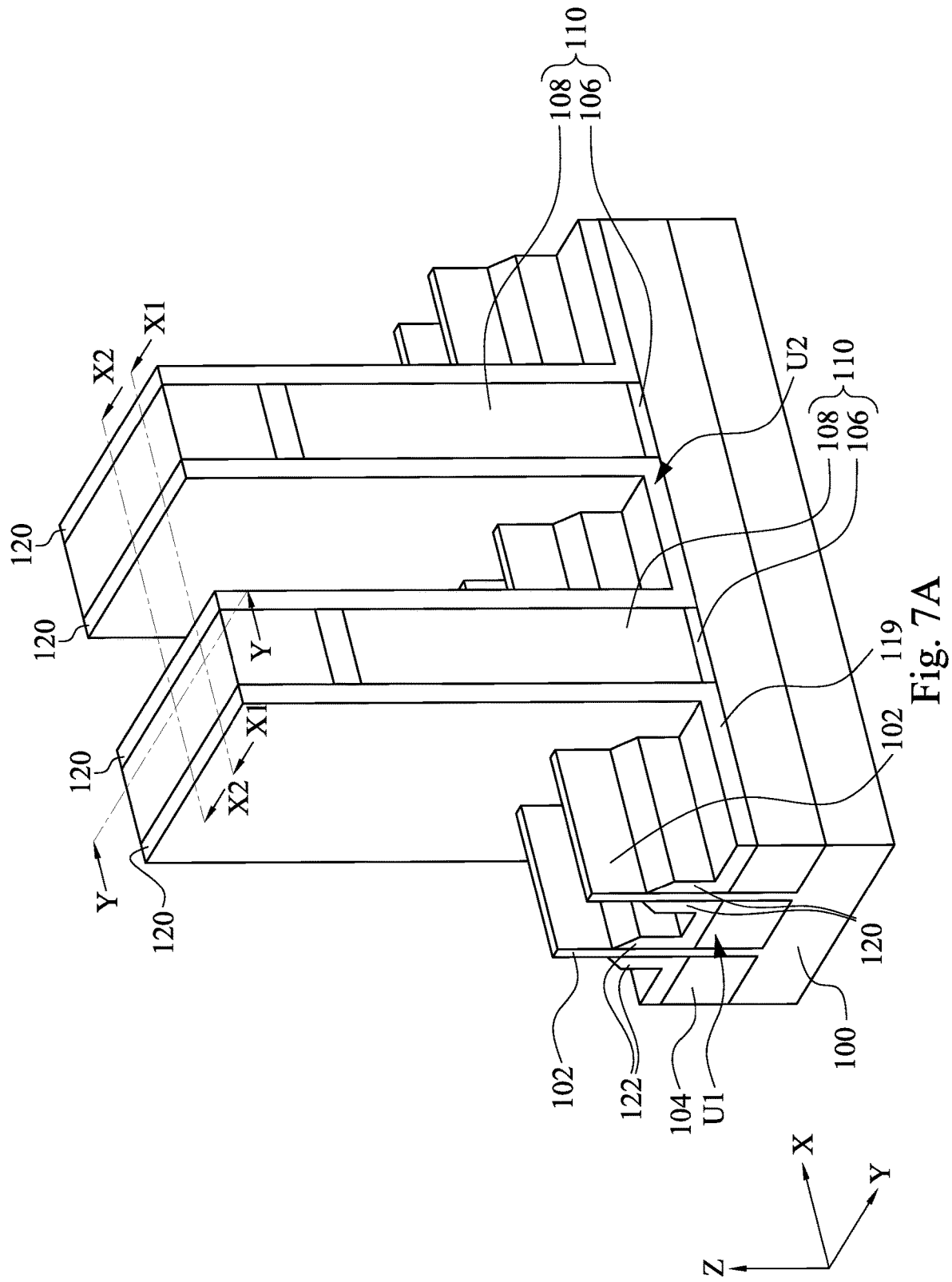
Figure 7C:
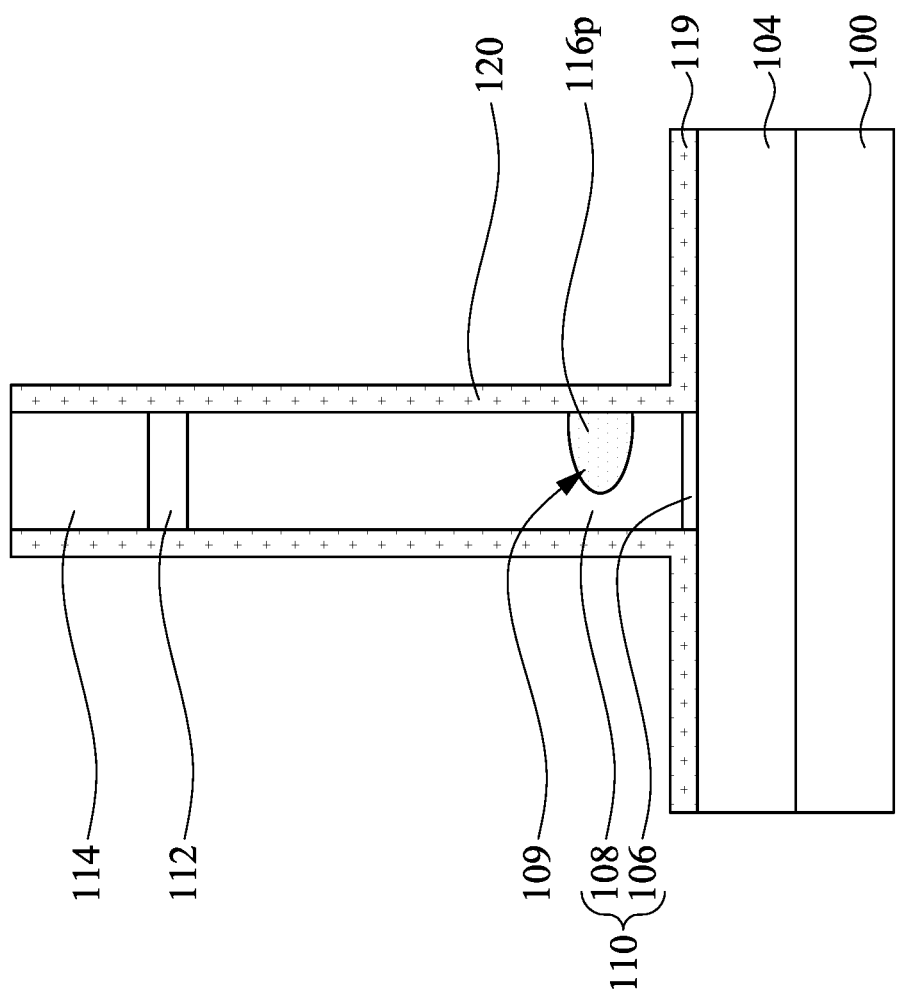
Figure 7D:
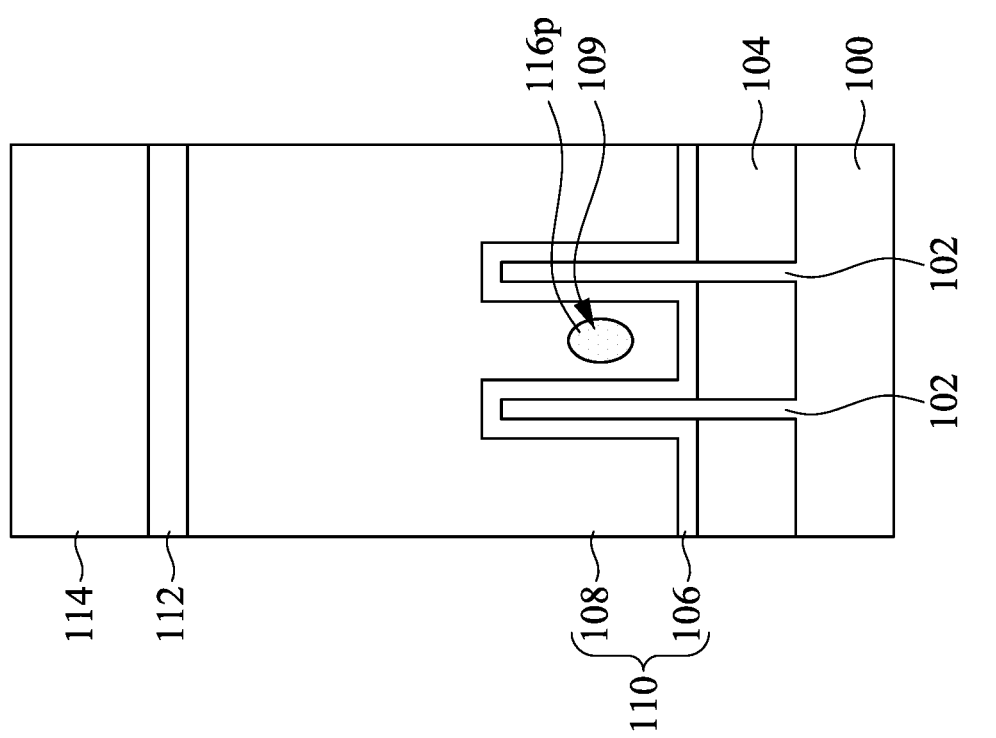

The process conditions for patterning the densified spacer layer 119 are controlled, so that top ends of the fin spacers 122 are lower than top surfaces of the semiconductor fins 102. In some embodiments, some horizontal portions of the densified spacer layer 119 may remain on the STI regions 104, as illustrated in FIG. 7A. This is because of the shadowing effect resulting from densely arranged dummy gate structures 110. The remaining horizontal spacer portion 119 may resemble a U-shape cross-section U1 with two fin spacers 122, and also resemble a U-shape cross-section U2 with two gate spacers 120. In some other embodiments, no horizontal portion of the densified spacer layer 119 remains on the STI regions 104.

Figure 8A:
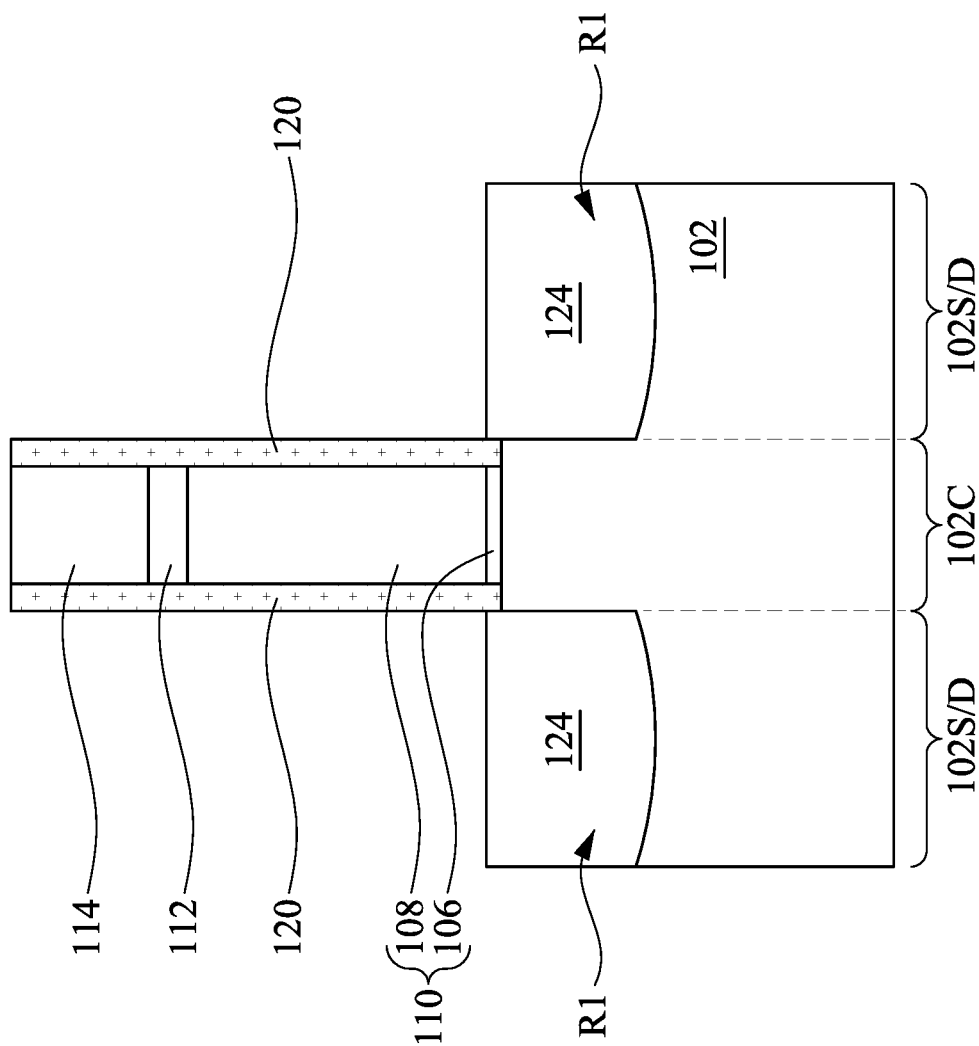
Figure 8B:
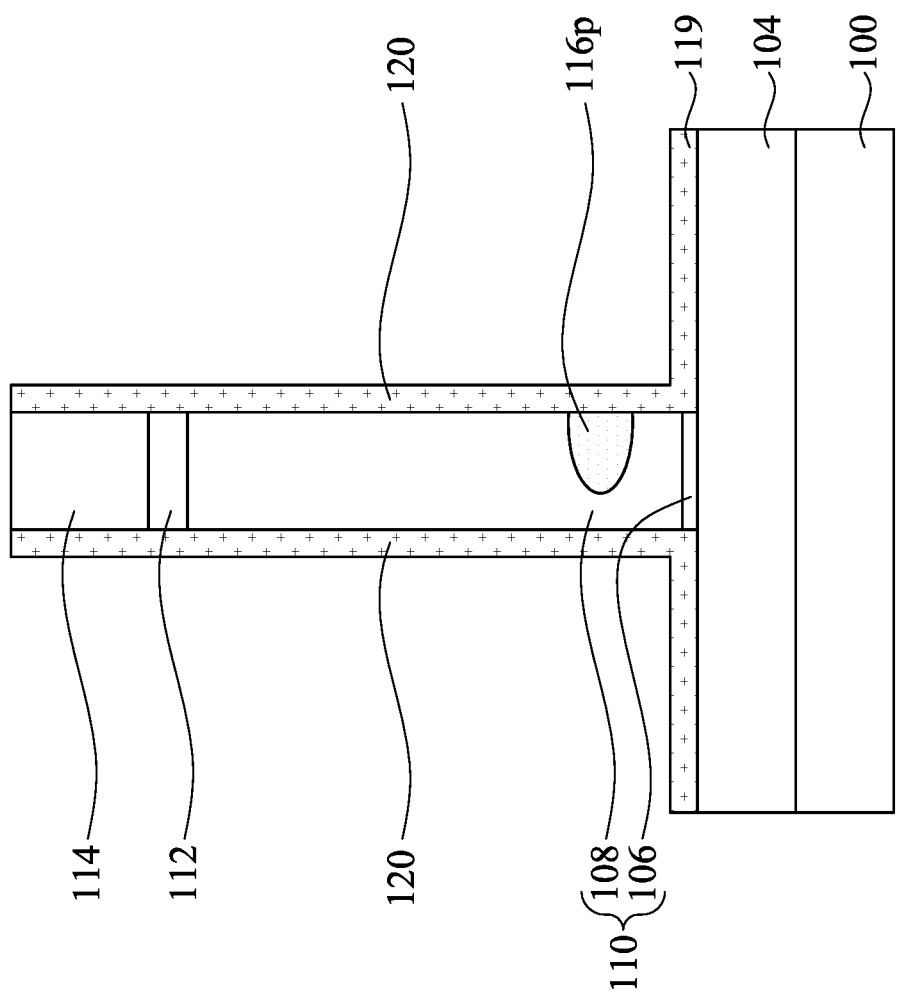
Figure 8C:
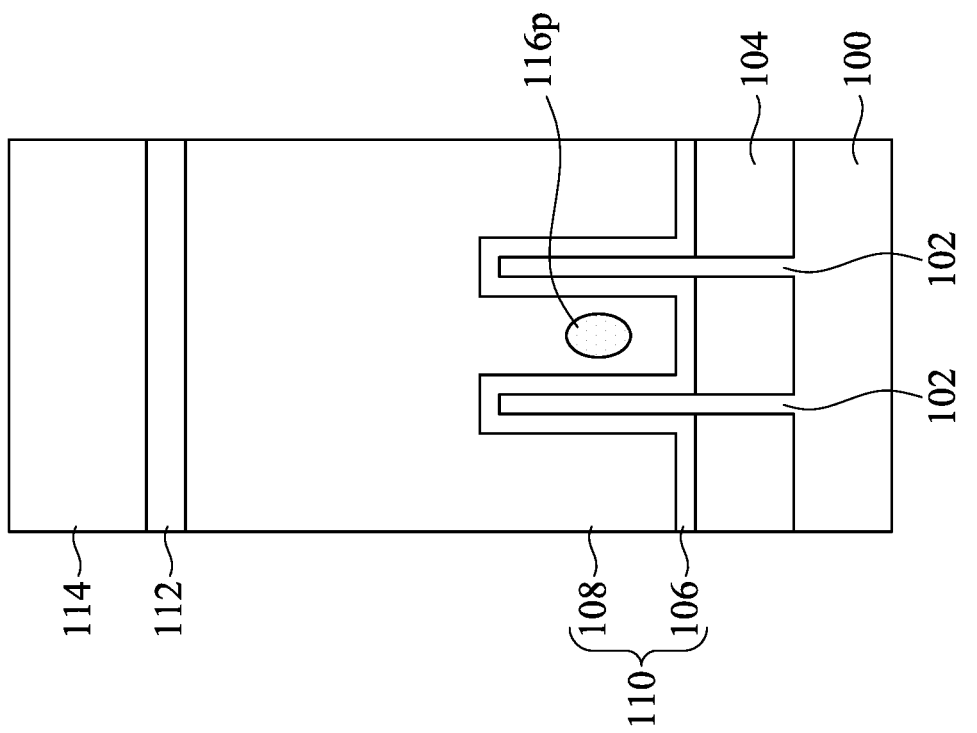

In FIGS. 8A-8C, exposed portions of the semiconductor fins 102 that extend laterally beyond the gate spacers 120 (e.g., in source and drain regions 102S/D of the fins 102) are etched by using, for example, an anisotropic etching process that uses the dummy gate structure 110 and the gate spacers 120 as an etch mask, resulting in recesses R1 into the semiconductor fins 102 and between corresponding dummy gate structures 110. In this disclosure, "source" and "drain" of transistors may be collectively referred to as "source/drain" or "S/D." In some embodiments, the anisotropic etching may be performed by a dry chemical etch with a plasma source and a reaction gas. The plasma source may be an inductively coupled plasma ICP source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Next, source/drain epitaxial structures 124 are epitaxially grown in the recesses R1. During the epitaxial growth process, the dummy gate structures 110 and gate spacers 120 limit the source/drain epitaxial structures 124 to the source/drain regions 102S/D of the fins 102. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the semiconductor fins 102. In some embodiments, an epitaxial material may be deposited by a selective epitaxial growth (SEG) process to fill the recesses R1 and extend further beyond the original surface of the semiconductor fins 102 to form raised source/drain epitaxy structures 124, which have top surfaces higher than top surfaces of the semiconductor fins 102.

In some embodiments, the source/drain epitaxial structures 124 may include Ge, Si, GaAs, AlGaAs, SiGe, GaAsP, SiP, or other suitable material. The source/drain epitaxial structures 124 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 124 are not in-situ doped, an implantation process (i.e., a junction implant process) is performed to dope the source/drain epitaxial structures 124. In some exemplary embodiments, the source/drain epitaxial structures 124 in an NFET device include SiP, while those in a PFET device include GeSnB and/or SiGeSnB.

Once the source/drain epitaxial structures 124 have been formed, an annealing process can be performed to activate the p-type dopants or n-type dopants in the source/drain epitaxial structures 124. The annealing process may be, for example, a rapid thermal anneal (RTA), a laser anneal, a millisecond thermal annealing (MSA) process or the like.

Figure 9B:
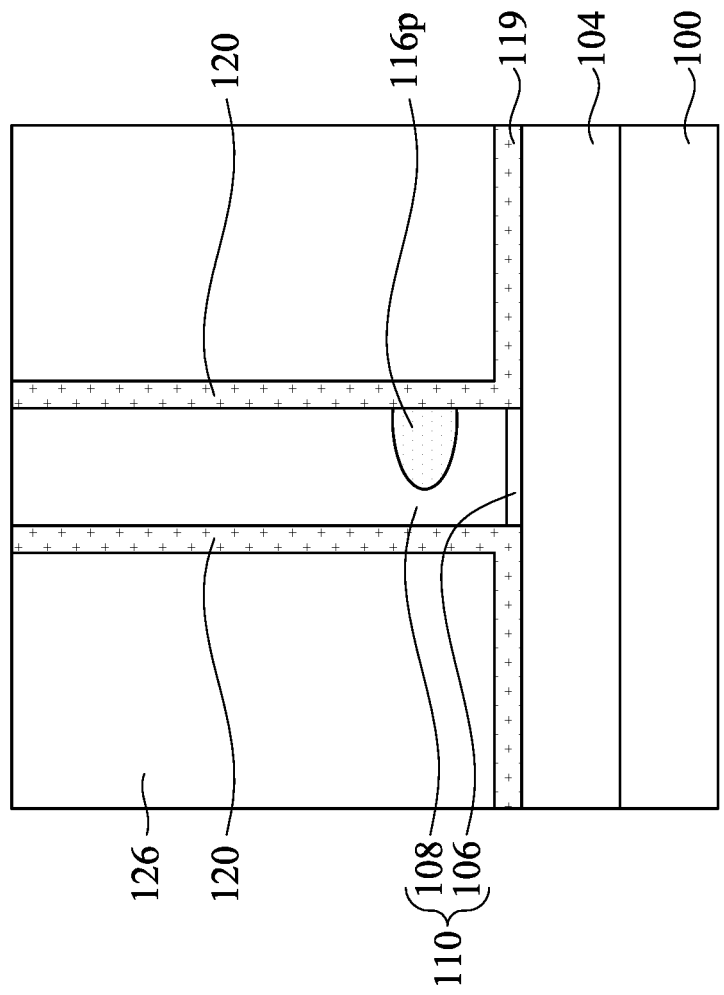
Figure 9C:
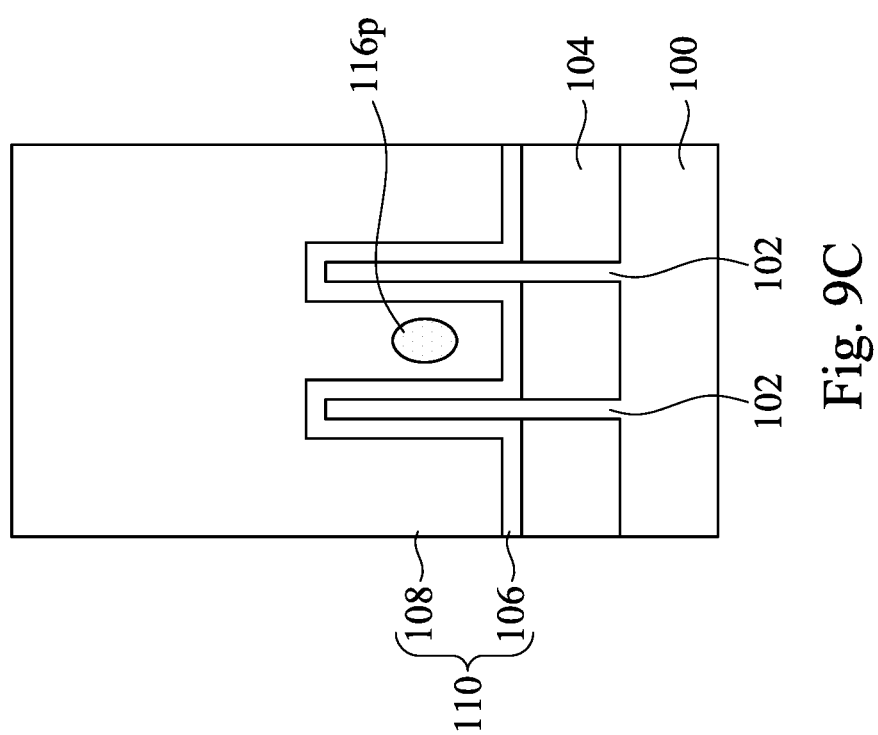

In FIGS. 9A-9C, an interlayer dielectric (ILD) layer 126 is formed over the substrate 100. In some embodiments, a contact etch stop layer (CESL) is optionally formed prior to forming the ILD layer 126. In some examples, the CESL includes a silicon nitride layer, silicon oxide layer, a silicon oxynitride layer, and/or other suitable materials having a different etch selectivity than the ILD layer 126. The CESL may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 126 may be deposited by a PECVD process or other suitable deposition techniques. In some embodiments, after formation of the ILD layer 126, the substrate 100 may be subjected to a high thermal budget process to anneal the ILD layer 126.

In some embodiments, after forming the ILD layer 126, a planarization process may be performed to remove excessive materials of the ILD layer 126. For example, a planarization process includes a chemical mechanical polish (CMP) process which removes portions of the ILD layer 126 (and CESL layer, if present) overlying the dummy gate structures 110. In some embodiments, the CMP process also removes the masks 112 and 114 (as shown in FIGS. 8A-8C) and exposes the dummy gate electrodes 108.

Figure 10A:
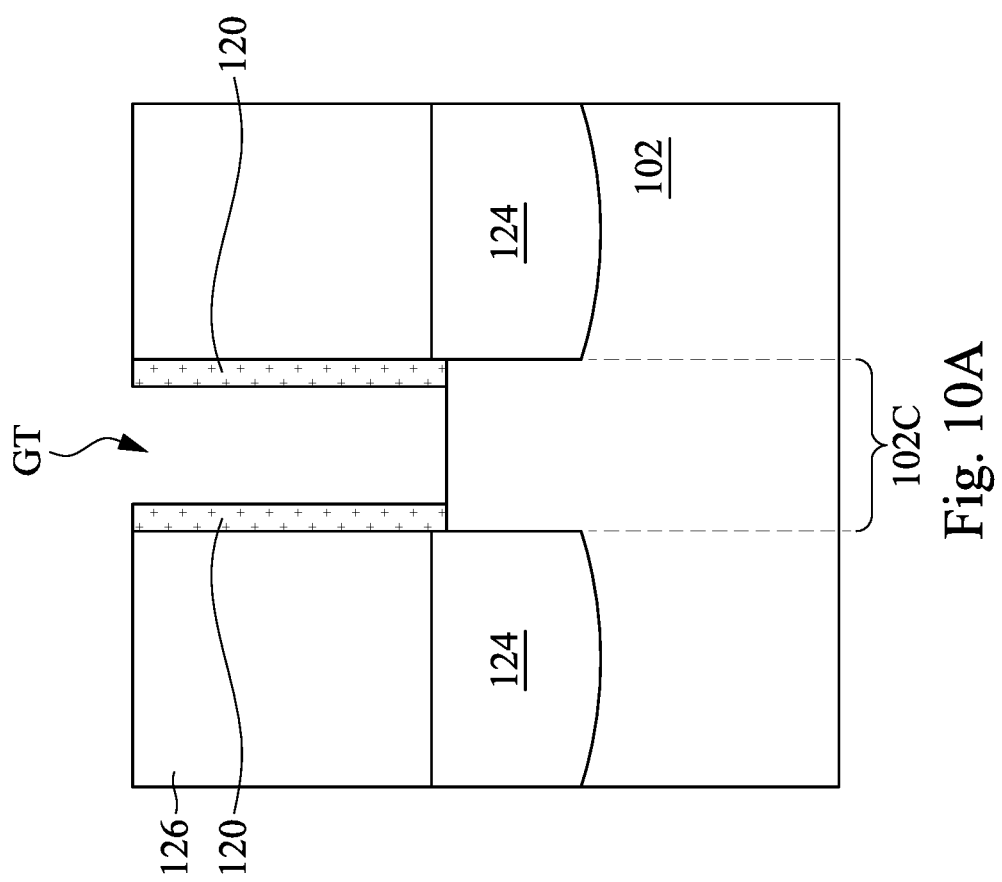
Figure 10B:
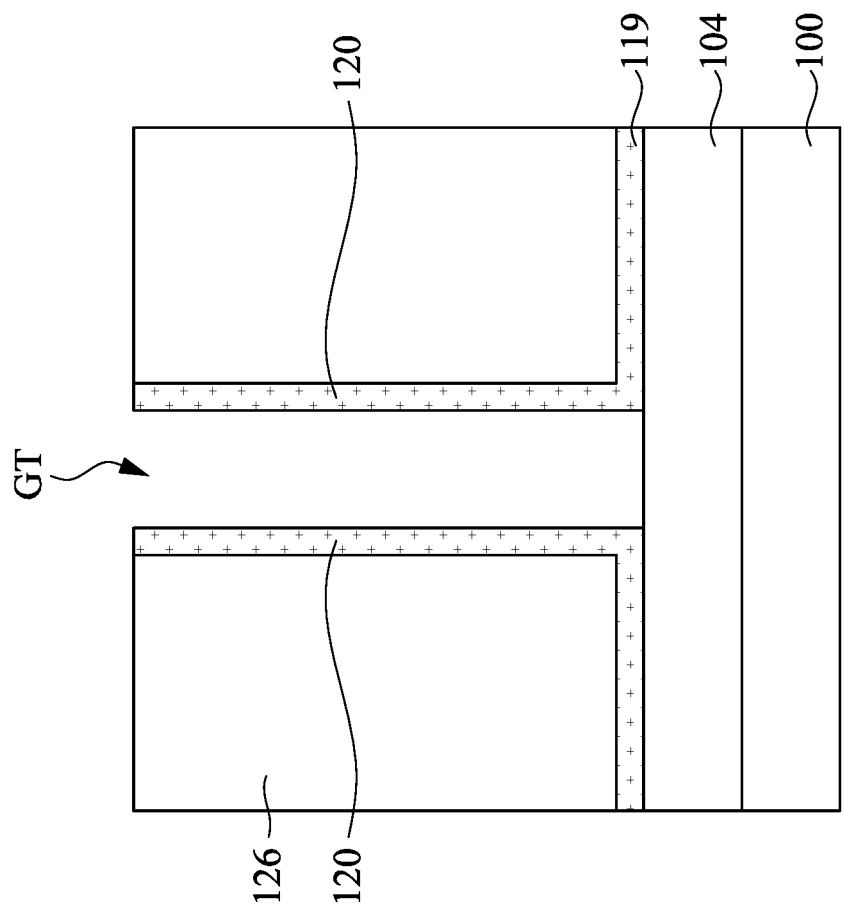
Figure 10C:
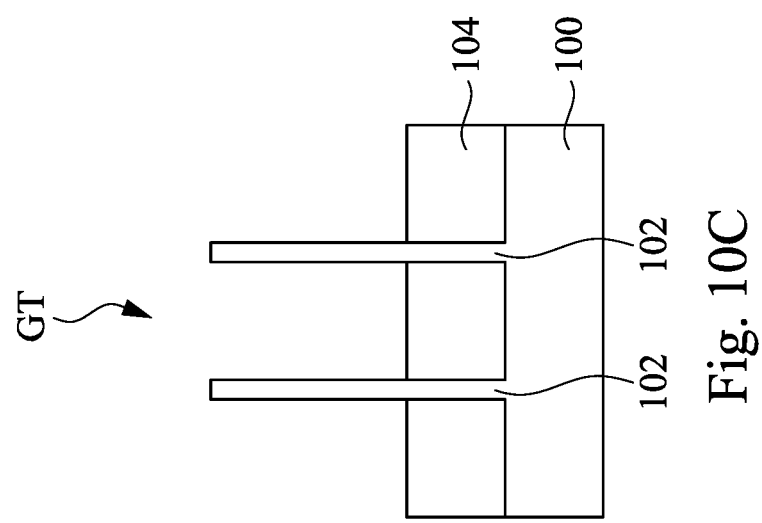

Next, in FIGS. 10A-10C, the dummy gate structures 110 are removed by using a selective etching process (e.g., selective dry etching, selective wet etching, or a combination thereof) that etches the materials of the dummy gate structures 110 at a faster etch rate than it etches other materials (e.g., densified gate spacers 120 and/or ILD layer 126), thus resulting in gate trenches GT between corresponding gate spacers 120. In some embodiments, the selective etching process also etches the porous spacer protruding portion 116p (as illustrated in FIGS. 9B and 9C) at a faster etch rate than it etches the densified gate spacers 120. As a result, the porous spacer protruding portion 116p can be removed in the selective etching process while the densified gate spacers 120 are not etched through, so as to prevent source/drain epitaxial structures 124 from being exposed.

In some embodiments where the porous spacer protruding portion 116p is porous SiCOH and the densified spacers 120 is densified SiCOH, an etch rate ratio of the porous SiCOH to the densified SiCOH is greater than about 3:1 or even greater than 10:1 in the dummy gate removal step. For example, the dummy gate removal step includes a first dry etching process followed by a second dry etching process, wherein the first dry etching process is plasma etching using a plasma etchant generated from an oxygen ($O_2$) gas, and the second dry etching is plasma etching using a plasma etchant generated from a gas mixture of an NF gas and an $NH_3$ gas. In some embodiments, the first dry etching is called a DPO etching process, and the second dry etching is called an IORM etching process. When the dummy gate removal step uses the combination of DPO etching process and IORM etching process, an etch amount of the porous SiCOH is in a range from about 60 angstroms to about 70 angstroms (e.g., about 63 angstroms) in a given duration time, and an etch amount of the densified SiCOH is in a range from about 15 angstroms to about 25 angstroms (e.g., about 19 angstroms) in the given duration time. In some embodiments where the etch amount of the porous SiCOH is about 63 angstroms and the etch amount of the densified SiCOH is about 19 angstroms, a ratio of the etch amount of the porous SiCOH to the etch amount of the densified SiCOH is greater than about 3:1.

In some other embodiments, the dummy gate removal step includes a first wet etching followed by a second wet etching process, wherein the first wet etching process uses sulfuric peroxide mixture (HTSPM) solution as a wet etchant, and the second wet etching process uses diluted hydrofluoric acid (DHF) solution as a wet etchant. When the dummy gate removal step uses the combination of HTSPM etching and DHF etching, an etch amount of the porous SiCOH is in a range from about 170 angstroms to about 180 angstroms (e.g., about 175 angstroms) in a given time duration, and an etch amount of the densified SiCOH is in a range from about 15 angstroms to about 20 angstroms (e.g., about 17 angstroms) the given duration time. In some embodiments where the etch amount of the porous SiCOH is about 175 angstroms and the etch amount of the densified SiCOH is about 17 angstroms, a ratio of the etch amount of the porous SiCOH to the etch amount of the densified SiCOH is greater than about 10:1.

Because of the high etch selectivity between the porous spacer protruding portion 116p (e.g., porous SiCOH) and the densified gate spacers 120 (e.g., densified SiCOH), the porous spacer protruding portion 116p can be removed from the gate trench GT, and the densified gate spacers 120 remain not etched through. Moreover, because the porous spacer protruding portion 116p is removed, a bottom portion of the dummy gate structure 110 below the porous spacer protruding portion 116p can be removed, which in turn prevents dummy gate residues (e.g., polysilicon residues) from being left in the gate trench GT after the dummy gate removal step is complete.

Figure 11B:
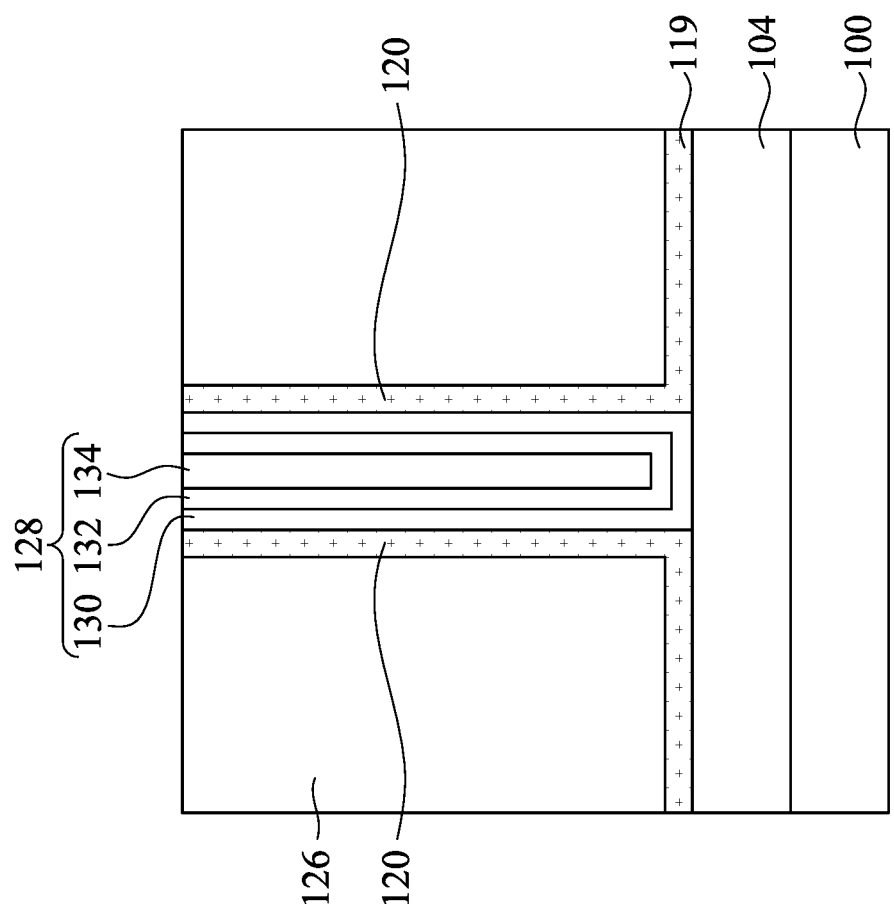
Figure 11C:
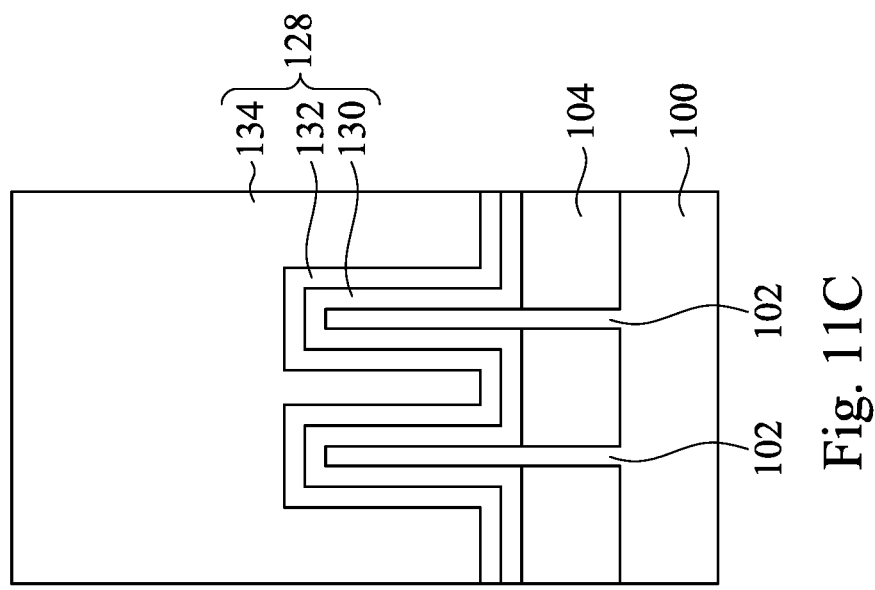

In FIGS. 11A-11C, replacement gate structures 128 are formed in the gate trenches GT. The gate structures 128 may be the final gates of FinFETs. The final gate structures each may be a high-k/metal gate stack, however other compositions are possible. In some embodiments, each of the gate structures 128 forms the gate associated with the three-sides of the channel region 102C provided by the fin 102. Stated another way, each of the gate structures 128 wraps around the fin 102 on three sides. In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trench. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (about 3.9-4.0). The work function metal layer 132 and/or fill metal layer 134 used within high-k/metal gate structures 128 may include a metal, metal alloy, or metal silicide. Formation of the high-k/metal gate structures 128 may include multiple deposition processes to form various gate materials, followed by one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12:
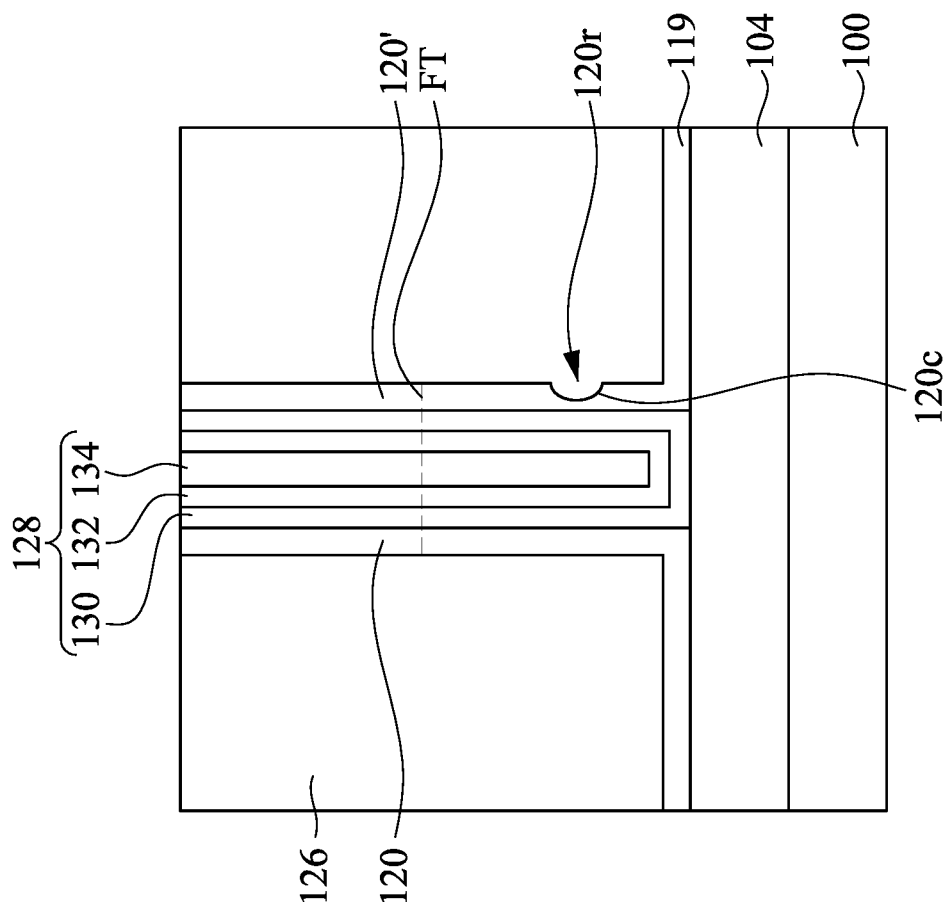
FIG. 12 is a cross-sectional view of a transistor according to some other embodiments of the present disclosure.

FIG. 12 is a cross-sectional view of another transistor, which shares some features of the previously described transistors. The transistor is different from the previously described transistors at least in that a gate spacer 120' has a recessed region 120r on its outermost sidewall. This is because the gate spacer 120' inherits the shape of vertical portion 116v of the porous spacer layer 116 (as illustrated in FIG. 5C), which is affected by the topography of gate sidewall that has a void 109 (as illustrated in FIG. 5C). In some embodiments, the recessed region 120r is defined by a concave surface 120c of the outermost sidewall of the gate spacer 120'. In some embodiments, the recessed region 120r is at a position lower than a top end FT of semiconductor fins 102. This is because the void 109 is formed in the fin-to-fin region and below top ends of semiconductor fins 102, as illustrated in 5D. In some embodiments, the gate spacer 120 on a first side (e.g., left side in FIG. 12) of the gate structure 128 is asymmetric to the gate spacer 120' on a second side (e.g., right side in FIG. 12) of the gate structure 128, because the gate spacer 120 has a linear outermost sidewall without a recessed region.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the dummy gate removal step leaves no or negligible dummy gate residue in the gate trench, even if a spacer material is filled in a void in the dummy gate structure. Another advantage is that the dummy gate removal step can remove the spacer material in the void in the dummy gate structure while result in no or negligible etch amount in the gate sidewall spacers, because the gate sidewall spacers have been densified before the dummy gate removal step.

In some embodiments, a method comprises forming semiconductor fins extending from a substrate; forming a dummy gate structure extending across the semiconductor fins, the dummy gate structure having a void between the semiconductor fins; depositing a spacer layer over the dummy gate structure, the spacer layer having a first portion in the void of the dummy gate structure and a second portion outside the void of the dummy gate structure; treating the spacer layer such that the second portion of the spacer layer has a different material composition than the first portion of the spacer layer; etching the second portion of the spacer layer to form gate spacers on sidewalls of the dummy gate structure; performing an etching process on the dummy gate structure to form a gate trench between the gate spacers, wherein the etching process etches the first portion of the spacer layer at a faster etch rate than etching the gate spacers; and forming a gate structure in the gate trench. In some embodiments, the spacer layer is treated by hydrogen radicals. In some embodiments, treating the spacer layer is performed such that the second portion of the spacer layer has a greater density than the first portion of the spacer layer. In some embodiments, treating the spacer layer is performed such that the second portion of the spacer layer has a greater dielectric constant than the first portion of the spacer layer. In some embodiments, treating the spacer layer is performed such that a dielectric constant of the second portion of the spacer layer increases from an original value to a final value, the original value is less than a dielectric constant of silicon oxide, and the final value is greater than the dielectric constant of silicon oxide. In some embodiments, after the dielectric constant of the second portion of the spacer layer has increased to the final value greater than the dielectric constant of silicon oxide, a dielectric constant of the first portion of the spacer layer is less than the dielectric constant of silicon oxide. In some embodiments, treating the spacer layer is performed such that the second portion of the spacer layer has a lower carbon atomic percentage than the first portion of the spacer layer. In some embodiments, treating the spacer layer is performed such that the second portion of the spacer layer has a greater oxygen atomic percentage than the first portion of the spacer layer. In some embodiments, treating the spacer layer is performed such that the second portion of the spacer layer has a greater silicon atomic percentage than the first portion of the spacer layer. In some embodiments, after treating the spacer layer, the first portion and the second portion of the spacer layer are both nitrogen-free.

In some embodiments, a method comprises forming semiconductor fins over a substrate; depositing a polysilicon layer over the semiconductor fins, the polysilicon layer having a void; patterning the polysilicon layer into a polysilicon structure such that the void is exposed at a sidewall of the polysilicon structure; depositing a spacer layer over the polysilicon structure, the spacer layer having an outer portion out of the void and an inner portion extending from the outer portion into the void; performing a radical treatment to densify the outer portion of the spacer layer, while leaving the inner portion of the spacer layer undensified; patterning the densified outer portion of the spacer layer into gate spacers on opposite sidewalls of the polysilicon structure; performing an etching process to the polysilicon structure, wherein in the etching process, the undensified inner portion of the spacer layer has a greater etch amount than an etch amount of the gate spacers; and after the etching process is complete, forming a gate structure between the gate spacers. In some embodiments, the radical treatment uses hydrogen radicals. In some embodiments, a ratio of the etch amount of the undensified inner portion of the spacer layer to the etch amount of the gate spacers is greater than about 3:1. In some embodiments, the radical treatment results in an increase in a dielectric constant of the outer portion of the spacer layer. In some embodiments, the radical treatment results in an increase in an oxygen atomic percentage of the outer portion of the spacer layer. In some embodiments, the radical treatment results in a decrease in a carbon atomic percentage of the outer portion of the spacer layer. In some embodiments, the radical treatment results in an increase in a silicon atomic percentage of the outer portion of the spacer layer.

In some embodiments, a semiconductor device comprises a semiconductor fin, a gate structure, a source epitaxial structure, a drain epitaxial structure, a first gate spacer, and a second gate spacer. The gate structure extends across the semiconductor fin. The source epitaxial structure and the drain epitaxial structure are on opposite sides of the gate structure, respectively. The first gate spacer separates the source epitaxial structure from the gate structure. The second gate spacer separates the drain epitaxial structure from the gate structure. The first and second gate spacers are made of an organosilicate glass material having a dielectric constant greater than a dielectric constant of silicon oxide. In some embodiments, an outermost sidewall of one of the first and second gate spacers has a recessed region at a position lower than a top end of the semiconductor fin. In some embodiments, a silicon atomic percentage and an oxygen atomic percentage of the organosilicate glass material are both greater than a carbon atomic percentage of the organosilicate glass material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming semiconductor fins extending from a substrate;
   forming a dummy gate structure extending across the semiconductor fins, the dummy gate structure having a void between the semiconductor fins;
   depositing a spacer layer over the dummy gate structure, the spacer layer having a first portion in the void of the dummy gate structure and a second portion outside the void of the dummy gate structure;

treating the spacer layer such that the second portion of the spacer layer has a different material composition than the first portion of the spacer layer;

etching the second portion of the spacer layer to form gate spacers on sidewalls of the dummy gate structure;

performing an etching process on the dummy gate structure to form a gate trench between the gate spacers, wherein the etching process etches the first portion of the spacer layer at a faster etch rate than etching the gate spacers; and forming a gate structure in the gate trench.

2. The method of claim 1, wherein the spacer layer is treated by hydrogen radicals.

3. The method of claim 1, wherein treating the spacer layer is performed such that the second portion of the spacer layer has a greater density than the first portion of the spacer layer.

4. The method of claim 1, wherein treating the spacer layer is performed such that the second portion of the spacer layer has a greater dielectric constant than the first portion of the spacer layer.

5. The method of claim 1, wherein treating the spacer layer is performed such that a dielectric constant of the second portion of the spacer layer increases from an original value to a final value, the original value is less than a dielectric constant of silicon oxide, and the final value is greater than the dielectric constant of silicon oxide.

6. The method of claim 5, wherein after the dielectric constant of the second portion of the spacer layer has increased to the final value greater than the dielectric constant of silicon oxide, a dielectric constant of the first portion of the spacer layer is less than the dielectric constant of silicon oxide.

7. The method of claim 1, wherein treating the spacer layer is performed such that the second portion of the spacer layer has a lower carbon atomic percentage than the first portion of the spacer layer.

8. The method of claim 1, wherein treating the spacer layer is performed such that the second portion of the spacer layer has a greater oxygen atomic percentage than the first portion of the spacer layer.

9. The method of claim 1, wherein treating the spacer layer is performed such that the second portion of the spacer layer has a greater silicon atomic percentage than the first portion of the spacer layer.

10. The method of claim 1, wherein after treating the spacer layer, the first portion and the second portion of the spacer layer are both nitrogen-free.

11. A method comprising:

forming semiconductor fins over a substrate;

depositing a polysilicon layer over the semiconductor fins, the polysilicon layer having a void;

patterning the polysilicon layer into a polysilicon structure such that the void is exposed at a sidewall of the polysilicon structure;

depositing a spacer layer over the polysilicon structure, the spacer layer having an outer portion out of the void and an inner portion extending from the outer portion into the void;

performing a radical treatment to densify the outer portion of the spacer layer, while leaving the inner portion of the spacer layer undensified;

patterning the densified outer portion of the spacer layer into gate spacers on opposite sidewalls of the polysilicon structure;

performing an etching process to the polysilicon structure, wherein in the etching process, the undensified inner portion of the spacer layer has an etch amount greater than an etch amount of the gate spacers; and after the etching process is complete, forming a gate structure between the gate spacers.

12. The method of claim 11, wherein the radical treatment uses hydrogen radicals.

13. The method of claim 11, wherein a ratio of the etch amount of the undensified inner portion of the spacer layer to the etch amount of the gate spacers is greater than about 3:1.

14. The method of claim 11, wherein the radical treatment results in an increase in a dielectric constant of the outer portion of the spacer layer.

15. The method of claim 11, wherein the radical treatment results in an increase in an oxygen atomic percentage of the outer portion of the spacer layer.

16. The method of claim 11, wherein the radical treatment results in a decrease in a carbon atomic percentage of the outer portion of the spacer layer.

17. The method of claim 11, wherein the radical treatment results in an increase in a silicon atomic percentage of the outer portion of the spacer layer.

18. A method comprising:

forming a semiconductor fin over a substrate;

forming a gate structure extending across the semiconductor fin;

forming a source epitaxial structure and a drain epitaxial structure on opposite sides of the gate structure, respectively;

forming a first gate spacer separating the source epitaxial structure from the gate structure; and forming a second gate spacer separating the drain epitaxial structure from the gate structure, the first and second gate spacers being made of an organosilicate glass material having a dielectric constant greater than a dielectric constant of silicon oxide, wherein a silicon atomic percentage and an oxygen atomic percentage of the organosilicate glass material are both greater than a carbon atomic percentage of the organosilicate glass material.

19. The method of claim 18, wherein an outermost sidewall of one of the first and second gate spacers has a recessed region at a position lower than a top end of the semiconductor fin.

20. The method of claim 18, wherein the organosilicate glass material has a density in a range from about 2.2 g/cm$^3$ to about 2.4 g/cm$^3$.

* * * * *